US011906817B2

(12) United States Patent
Wang et al.

(10) Patent No.: US 11,906,817 B2
(45) Date of Patent: Feb. 20, 2024

(54) EYEGLASSES

(71) Applicant: SHENZHEN SHOKZ CO., LTD., Guangdong (CN)

(72) Inventors: Yueqiang Wang, Shenzhen (CN); Haofeng Zhang, Shenzhen (CN); Yongjian Li, Shenzhen (CN); Yunbin Chen, Shenzhen (CN); Fen You, Shenzhen (CN); Lei Zhang, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 603 days.

(21) Appl. No.: 17/138,909

(22) Filed: Dec. 31, 2020

(65) Prior Publication Data
US 2021/0116723 A1 Apr. 22, 2021

Related U.S. Application Data

(63) Continuation of application No. PCT/CN2019/102407, filed on Aug. 24, 2019.

(30) Foreign Application Priority Data

Aug. 24, 2018 (CN) .......................... 201810975515.1
Jan. 5, 2019 (CN) .......................... 201910009904.3
Jan. 5, 2019 (CN) .......................... 201920031804.6

(51) Int. Cl.
G02C 11/06 (2006.01)
G02C 5/14 (2006.01)
(Continued)

(52) U.S. Cl.
CPC ................ G02C 11/10 (2013.01); G02C 5/14 (2013.01); G02C 5/22 (2013.01); G02C 5/2254 (2013.01);
(Continued)

(58) Field of Classification Search
CPC . G02C 11/00; G02C 5/00; H04R 1/00; H04R 9/00; H04R 25/00; H04R 2460/00; H05K 1/00; H05K 2201/00
(Continued)

(56) References Cited

U.S. PATENT DOCUMENTS 2,327,320 A 8/1943 Shapiro
4,902,120 A 2/1990 Weyer
(Continued)

FOREIGN PATENT DOCUMENTS

CN 2639920 Y 9/2004
CN 102141688 A 8/2011
(Continued)

OTHER PUBLICATIONS

International Search Report in PCT/CN2019/102394 dated Nov. 28, 2019, 8 pages.
(Continued)

Primary Examiner — Joseph P Martinez
Assistant Examiner — Grant A Gagnon
(74) Attorney, Agent, or Firm — METIS IP LLC

(57) ABSTRACT

The present disclosure provides eyeglasses including: an eyeglass rim; an eyeglass temple, the eyeglass temple comprising a control circuit or a battery; a rotating shaft, the rotating shaft being configured to connect the eyeglass rim and the eyeglass temple, so that the eyeglass rim and the eyeglass temple are relatively rotated around the rotating shaft, and the rotating shaft being disposed with a rotating shaft wiring channel along an axial direction; and a speaker, the speaker comprising an earphone core, the speaker being connected to the eyeglass temple, the control circuit or battery in the eyeglass temple driving the earphone core to vibrate through the connection wire, wherein the earphone core vibrates to generate a driving force to drive a housing
(Continued)

panel of the speaker to vibrate, and a straight line of the driving force being not parallel to a normal line of the housing panel.

20 Claims, 14 Drawing Sheets

(51) Int. Cl.
*G02C 5/22* (2006.01)
*H04R 9/06* (2006.01)
*H04R 9/02* (2006.01)
*G02C 11/00* (2006.01)
*H04R 1/02* (2006.01)
*H04R 1/10* (2006.01)
*H04R 1/06* (2006.01)
*H04R 1/28* (2006.01)
*H05K 1/02* (2006.01)
*H04R 25/00* (2006.01)
*H04R 1/04* (2006.01)
*H05K 1/18* (2006.01)

(52) U.S. Cl.
CPC ............ *G02C 11/06* (2013.01); *H04R 1/02* (2013.01); *H04R 1/028* (2013.01); *H04R 1/04* (2013.01); *H04R 1/06* (2013.01); *H04R 1/10* (2013.01); *H04R 1/1008* (2013.01); *H04R 1/1033* (2013.01); *H04R 1/1041* (2013.01); *H04R 1/1075* (2013.01); *H04R 1/1083* (2013.01); *H04R 1/28* (2013.01); *H04R 9/02* (2013.01); *H04R 9/025* (2013.01); *H04R 9/06* (2013.01); *H04R 25/65* (2013.01); *H05K 1/028* (2013.01); *H05K 1/189* (2013.01); *H04R 2460/13* (2013.01); *H05K 2201/05* (2013.01)

(58) Field of Classification Search
USPC ........................................................ 351/158
See application file for complete search history.

(56) References Cited

U.S. PATENT DOCUMENTS

| 6,850,138 | B1 | 2/2005 | Sakai |
| 7,289,767 | B2 | 10/2007 | Lai |
| 2003/0048913 | A1 | 3/2003 | Lee et al. |
| 2008/0013041 | A1 | 1/2008 | Chou |
| 2009/0208031 | A1 | 8/2009 | Abolfathi |
| 2009/0290730 | A1 | 11/2009 | Fukuda et al. |
| 2010/0322454 | A1 | 12/2010 | Ambrose et al. |
| 2011/0200204 | A1 | 8/2011 | Horigome et al. |
| 2014/0253867 | A1 | 9/2014 | Jiang et al. |
| 2015/0030189 | A1 | 1/2015 | Nabata et al. |
| 2015/0256656 | A1 | 9/2015 | Horii |
| 2015/0257662 | A1 | 9/2015 | Lee et al. |
| 2015/0326967 | A1 | 11/2015 | Otani |
| 2016/0234613 | A1 | 8/2016 | Westerkull |
| 2016/0246076 | A1 | 8/2016 | Wei |
| 2017/0090201 | A1 | 3/2017 | Guo |
| 2020/0336824 | A1 | 10/2020 | Zheng et al. |
| 2020/0344542 | A1 | 10/2020 | Liu et al. |

FOREIGN PATENT DOCUMENTS

| CN | 201984240 U | 9/2011 |
| CN | 102523546 A | 6/2012 |
| CN | 202364340 U | 8/2012 |
| CN | 103167390 A | 6/2013 |
| CN | 203786416 U | 8/2014 |
| CN | 204374548 U | 6/2015 |
| CN | 105007551 A | 10/2015 |
| CN | 204887455 U | 12/2015 |
| CN | 205103503 U | 3/2016 |
| CN | 205301727 U | 6/2016 |
| CN | 205720956 U | 11/2016 |
| CN | 205793159 U | 12/2016 |
| CN | 205793173 U | 12/2016 |
| CN | 205961389 U | 2/2017 |
| CN | 205987287 U | 2/2017 |
| CN | 206061075 U | 3/2017 |
| CN | 106937221 A | 7/2017 |
| CN | 106954150 A | 7/2017 |
| CN | 106954151 A | 7/2017 |
| CN | 106954153 A | 7/2017 |
| CN | 106974645 A | 7/2017 |
| CN | 206365029 U | 7/2017 |
| CN | 106997107 A | 8/2017 |
| CN | 206387972 U | 8/2017 |
| CN | 206421112 U | 8/2017 |
| CN | 206640748 U | 11/2017 |
| CN | 206920741 U | 1/2018 |
| CN | 107948881 A | 4/2018 |
| CN | 207266241 U | 4/2018 |
| CN | 207424414 U | 5/2018 |
| CN | 207443120 U | 6/2018 |
| CN | 108391188 A | 8/2018 |
| CN | 207718105 U | 8/2018 |
| CN | 207720370 U | 8/2018 |
| CN | 108600920 A | 9/2018 |
| CN | 108776393 A | 11/2018 |
| CN | 108845436 A | 11/2018 |
| CN | 108873372 A | 11/2018 |
| CN | 208079380 U | 11/2018 |
| CN | 109061902 A | 12/2018 |
| CN | 109495809 A | 3/2019 |
| CN | 208780924 U | 4/2019 |
| CN | 208780925 U | 4/2019 |
| CN | 208780932 U | 4/2019 |
| CN | 208847977 U | 5/2019 |
| CN | 208847981 U | 5/2019 |
| CN | 110022516 A | 7/2019 |
| CN | 209184747 U | 7/2019 |
| CN | 209267805 U | 8/2019 |
| CN | 209358728 U | 9/2019 |
| EP | 2011367 B1 | 12/2014 |
| JP | S59161928 A | 9/1984 |
| JP | 2006157318 A | 6/2006 |
| JP | 2006332715 A | 12/2006 |
| JP | 2007251358 A | 9/2007 |
| JP | 2013055571 A | 3/2013 |
| JP | 2014072555 A | 4/2014 |
| WO | 9623373 A1 | 8/1996 |
| WO | 2004095878 A2 | 11/2004 |
| WO | 2006023341 A2 | 3/2006 |
| WO | 2007070508 A2 | 6/2007 |
| WO | 2007133055 A1 | 11/2007 |
| WO | 2015115693 A1 | 8/2015 |

OTHER PUBLICATIONS

International Search Report in PCT/CN2019/102377 dated Dec. 3, 2019, 8 pages.
International Search Report in PCT/CN2019/102378 dated Nov. 6, 2019, 8 pages.
International Search Report in PCT/CN2019/102385 dated Nov. 18, 2019, 6 pages.
International Search Report in PCT/CN2019/102389 dated Nov. 28, 2019, 8 pages.
International Search Report in PCT/CN2019/102396 dated Nov. 27, 2019, 8 pages.
International Search Report in PCT/CN2019/102395 dated Nov. 27, 2019, 9 pages.
International Search Report in PCT/CN2019/102406 dated Nov. 26, 2019, 7 pages.
International Search Report in PCT/CN2019/102407 dated Nov. 8, 2019, 6 pages.
International Search Report in PCT/CN2019/102408 dated Nov. 6, 2019, 6 pages.

(56) References Cited

OTHER PUBLICATIONS

International Search Report in PCT/CN2019/102398 dated Oct. 31, 2019, 6 pages.
International Search Report in PCT/CN2019/102386 dated Nov. 25, 2019, 7 pages.
International Search Report in PCT/CN2019/102390 dated Nov. 22, 2019, 8 pages.
International Search Report in PCT/CN2019/102391 dated Nov. 22, 2019, 8 pages.
The Extended European Search Report in European Application No. 14877111.6 dated Mar. 17, 2017, 6 pages.
The Communication Pursuant to Article 94(3) EPC in European Application No. 14877111.6 dated Apr. 23, 2018, 6 pages.
First Examination Report in Indian Application No. 201617026062 dated Nov. 13, 2020, 6 pages.
Notice of Reasons for Rejection in Japanese Application No. 2016-545828 dated Oct. 10, 2017, 6 pages.
Decision to Grant a Patent in Japanese Application No. 2016-545828 dated Jan. 16, 2018, 5 pages.
Decision of Patent Grant in Korea Application No. 10-2016-7017110 dated Jun. 14, 2018, 3 pages.

EYEGLASSES

CROSS-REFERENCE TO RELATED APPLICATION

This application is a Continuation of International Application No. PCT/CN2019/102407 filed on Aug. 24, 2019, which claims priority of Chinese Patent Application No. 201810975515.1 filed on Aug. 24, 2018, Chinese Patent Application No. 201910009904.3 filed on Jan. 5, 2019, and Chinese Patent Application No. 201920031804.6 filed on Jan. 5, 2019, the contents of each of which are hereby incorporated by reference in its entirety.

TECHNICAL FIELD

The present disclosure relates to the field of eyeglasses, and more specifically relates to eyeglasses having a speaker.

BACKGROUND

With the development of speaker technology, electronic products (e.g., earphones, MP3, etc.) have been widely used. Speakers may have different product forms. For example, a speaker may be integrated on eyeglasses (e.g., sunglasses, swimming eyeglasses, etc.) or fixed inside an ear or near the ear of a user through a special structure (e.g., an ear hook). As the functions of the products become more diverse, there may be more and more internal modules and wiring of the speaker, and the wiring may be more and more complicated. The complicated wiring may greatly occupy an internal space of the product, and an unreasonable wiring distribution may cause wires to affect each other, which may cause an abnormal sound and affect the sound quality of the speaker. Therefore, it may be necessary to provide a more efficient wiring technology, so as to simplify a wiring approach of the speaker and improve the sound quality of the speaker.

SUMMARY

An embodiment of the present specification may provide eyeglasses. The eyeglasses may include an eyeglass rim; an eyeglass temple, the eyeglass temple comprising a control circuit or a battery; a rotating shaft, the rotating shaft being configured to connect the eyeglass rim and the eyeglass temple, so that the eyeglass rim and the eyeglass temple are relatively rotated around the rotating shaft, and the rotating shaft is disposed with a rotating shaft wiring channel along an axial direction; a connection wire, the connection wire passing through the rotating shaft wiring channel and extending to the eyeglass rim and the eyeglass temple, respectively; and a speaker, the speaker comprising an earphone core, the speaker being connected to the eyeglass temple, the control circuit or battery in the eyeglass temple driving the earphone core to vibrate through the connection wire, wherein the earphone core vibrates to generate a driving force to drive a housing panel of the speaker to vibrate, and a straight line of the driving force is not parallel to a normal line of the housing panel.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures, and wherein:

FIG. 23 is a schematic diagram illustrating frequency response curves of a bone conduction speaker in a low-frequency part correspond to different angles θ according to some embodiments in the present disclosure; and.

DETAILED DESCRIPTION

Figure 1:
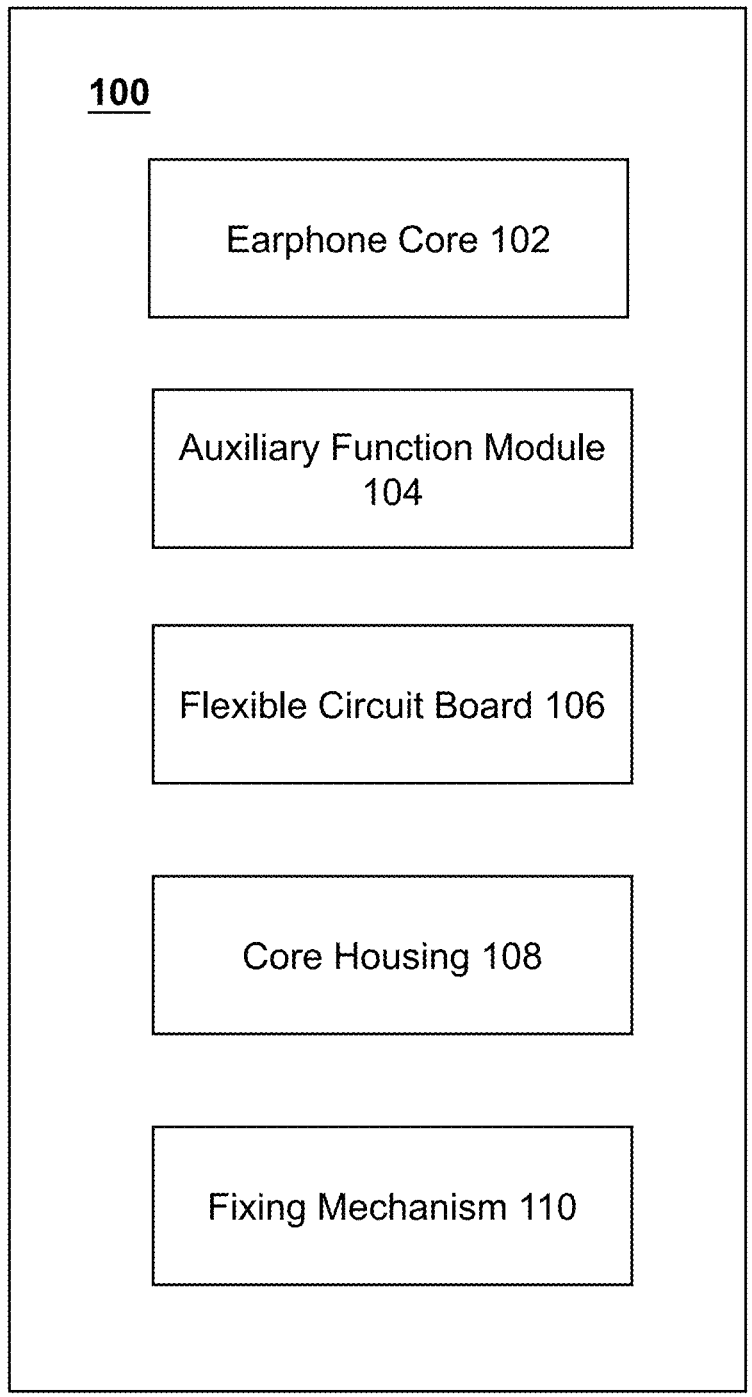
FIG. 1 is a block diagram illustrating a structure of a speaker according to some embodiments of the present disclosure.

In the following detailed description, numerous specific details are set forth by way of examples in order to provide a thorough understanding of the relevant disclosure. Obviously, drawings described below are only some examples or embodiments of the present disclosure. Those skilled in the art, without further creative efforts, may apply the present disclosure to other similar scenarios according to these drawings. It should be understood that the purposes of these illustrated embodiments are only provided to those skilled in the art to practice the application, and not intended to limit the scope of the present disclosure. Unless obviously obtained from the context or the context illustrates otherwise, the same numeral in the drawings refers to the same structure or operation.

As used in the disclosure and the appended claims, the singular forms "a," "an," and "the" may include plural referents unless the content clearly dictates otherwise. In general, the terms "comprise" and "include" merely prompt to include steps and elements that have been clearly identified, and these steps and elements do not constitute an exclusive listing. The methods or devices may also include other steps or elements. The term "based on" is "based at least in part on." The term "one embodiment" means "at least one embodiment;" the term "another embodiment" means "at least one other embodiment." Related definitions of other terms will be given in the description below. In the following, without loss of generality, the "eyeglasses" or "sunglasses" may be used when illustrating related technologies of conduction in the present disclosure. The illustration is only a form of conductive application. For those skilled in the art, "eyeglasses" or "sunglasses" may also be replaced with other similar words, such as "eye protection device," "eye wearable device," or the like. In fact, various implementations in the present disclosure may be easily applied to other hearing devices belonging to non-speaker component. For example, for those skilled in the art, after understanding the basic principles of eyeglasses, it may be possible to make various modifications and changes in the form and details of the specific methods and operations of implementing eyeglasses without departing from the principles. In particular, an environmental sound collection and processing function may be added to the eyeglasses to enable the eyeglasses to implement the function of a hearing aid. For example, a microphone may collect environmental sounds of a user/wearer, process the sounds using a certain algorithm and transmit the processed sound (or generated electrical signal) to a speaker. That is, the eyeglasses may be modified to include the function of collecting the environmental sounds, and after a certain signal processing, the sound may be transmitted to the user/wearer via the speaker, thereby implementing the function of the hearing aid. As an example, the algorithm mentioned herein may include noise cancellation, automatic gain control, acoustic feedback suppression, wide dynamic range compression, active environment recognition, active noise reduction, directional processing, tinnitus processing, multi-channel wide dynamic range compression, active howling suppression, volume control, or the like, or any combination thereof.

FIG. 1 is a block diagram illustrating a structure of a speaker according to some embodiments of the present disclosure.

A speaker 100 may include at least an earphone core 102, an auxiliary function module 104, and a flexible circuit board 106.

In some embodiments, the earphone core 102 may receive electrical audio signal(s) and convert the audio signal(s) into the sound signal(s). The flexible circuit board 106 may facilitate electrical connection(s) between different modules/components. For example, the flexible circuit board 106 may facilitate an electrical connection between the earphone core 102 and an external control circuit and an electrical connection between the earphone core 102 and the auxiliary function module 104.

In some embodiments, the earphone core 102 may include at least a magnetic circuit component, a vibration component, and a bracket that accommodates the magnetic circuit component and the vibration component. The magnetic circuit component may be used to provide a magnetic field. The vibration component may be used to convert an electrical signal input to the vibration component into a mechanical vibration signal so as to generate a sound. In some embodiments, the vibration component may include at least a coil and an inner lead. In some embodiments, the earphone core 102 may also include an external wire. The external wire may be capable of transmitting an audio current to the coil in the vibration component. One end of the external wire may be connected to the inner lead of the earphone core, and the other end may be connected to the flexible circuit board of the speaker. In some embodiments, the bracket may have a wiring groove. The external wire and/or the inner lead may be partially disposed of the wiring groove described in detail in other parts of the present disclosure.

In some embodiments, the auxiliary function module 104 may be used to receive auxiliary signal(s) and perform auxiliary function(s). The auxiliary function module 104 may be a module different from the earphone core and may be used for receiving the auxiliary signal(s) and performing the auxiliary function(s). In the present disclosure, the conversion of the audio signal into the sound signal may be considered as a main function of the speaker 100, and other functions different from the main function may be considered as the auxiliary function(s) of the speaker 100. For example, the auxiliary function(s) of the speaker 100 may include receiving a user sound and/or an ambient sound through a microphone, controlling a broadcasting process of the sound signal through a key, or the like, and a corresponding auxiliary function module may include a microphone, a key switch, etc., which may be set according to actual needs. The auxiliary signal(s) may be electric signal(s) related to the auxiliary function(s), optical signal(s) related to the auxiliary function(s), acoustic signal(s) related to the auxiliary function(s), vibration signal(s) related to the auxiliary function(s), or the like, or any combination thereof.

The speaker 100 may further include a core housing 108 for accommodating the earphone core 102, the auxiliary function module 104, and the flexible circuit board 106. When the speaker 100 is a bone conduction earphone, an inner wall of the core housing 108 may be directly or indirectly connected to the vibration component in the earphone core. When the user wears the bone conduction earphone, an outer wall of the core housing 108 may be in contact with the user and transmit the mechanical vibration of the vibration component to an auditory nerve through a bone, so that the human body may hear the sound. In some embodiments, the speaker may include the earphone core 102, the auxiliary function module 104, the flexible circuit board 106, and the core housing 108.

In some embodiments, the flexible circuit board 106 may be a flexible printed circuit board (FPC) accommodated in the inner space of the core housing 108. The flexible circuit board 106 may have high flexibility and be adapted to the inner space of the core housing 108. Specifically, in some embodiments, the flexible circuit board 106 may include a first board and a second board. The flexible circuit board 106 may be bent at the first board and the second board so as to adapt to a position of the flexible circuit board in the core housing 108, or the like. More details may refer to descriptions in other parts of the present disclosure.

In some embodiments, the speaker 100 may transmit the sound through a bone conduction approach. An outer surface of the core housing 108 may have a contact surface. The contact surface may be an outer surface of the speaker 100 in contact with the human body when the user wears the speaker 100. The speaker 100 may compress the contact surface against a preset area (e.g., a front end of a tragus, a position of a skull, or a back surface of an auricle), thereby effectively transmitting the vibration signal(s) to the auditory nerve of the user through the bone and improving the sound quality of the speaker 100. In some embodiments, the contact surface may be abutted on the back surface of the auricle. The mechanical vibration signal(s) may be transmitted from the earphone core to the core housing and transmitted to the back of the auricle through the contact surface of the core housing. The vibration signal(s) may then be transmitted to the auditory nerve by the bone near the back of the auricle. In this case, the bone near the back of the auricle may be closer to the auditory nerve, which may have a better conduction effect and improve the efficiency of transmitting the sound to the auditory nerve by the speaker 100.

In some embodiments, the speaker 100 may further include a fixing mechanism 110. The fixing mechanism 110 may be externally connected to the core housing 108 and used to support and maintain the position of the core housing 108. In some embodiments, a battery assembly and a control circuit may be disposed in the fixing mechanism 110. The battery assembly may provide electric energy to any electronic component in the speaker 100. The control circuit may control any function component in the speaker 100. The function component may include, but be not limited to, the earphone core, the auxiliary function module, or the like. The control circuit may be connected to the battery and other functional components through the flexible circuit board or the wire.

In some embodiments, the fixing mechanism 110 may be an eyeglass rim, a hat, a headgear, other headwear accessories, or the like, or any combination thereof. For example, the fixing mechanism 110 may be an eyeglass rim. A cavity may be formed inside the eyeglass rim. The cavity may accommodate the battery assembly, the flexible circuit board, and the control circuit. In this case, the earphone core 102 may be located at the end of the eyeglass temple, which may be located near the ear and provide the sound signal(s) when the user wears the eyeglasses.

Figure 2:
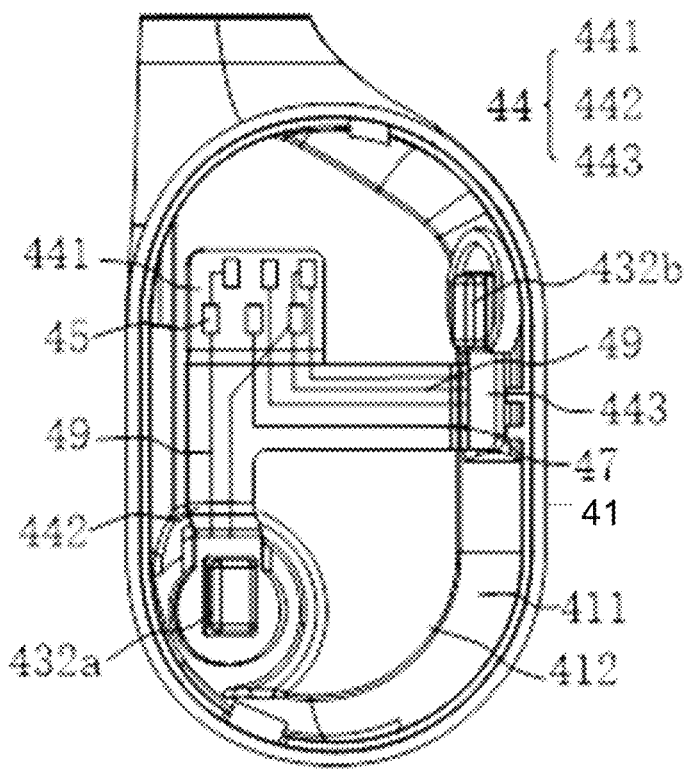
FIG. 2 is a schematic diagram illustrating a structure of a flexible circuit board according to some embodiments of the present disclosure.

FIG. 2 is a schematic diagram illustrating a structure of a flexible circuit board located inside a core housing according to some embodiments of the present disclosure.

Figure 3:
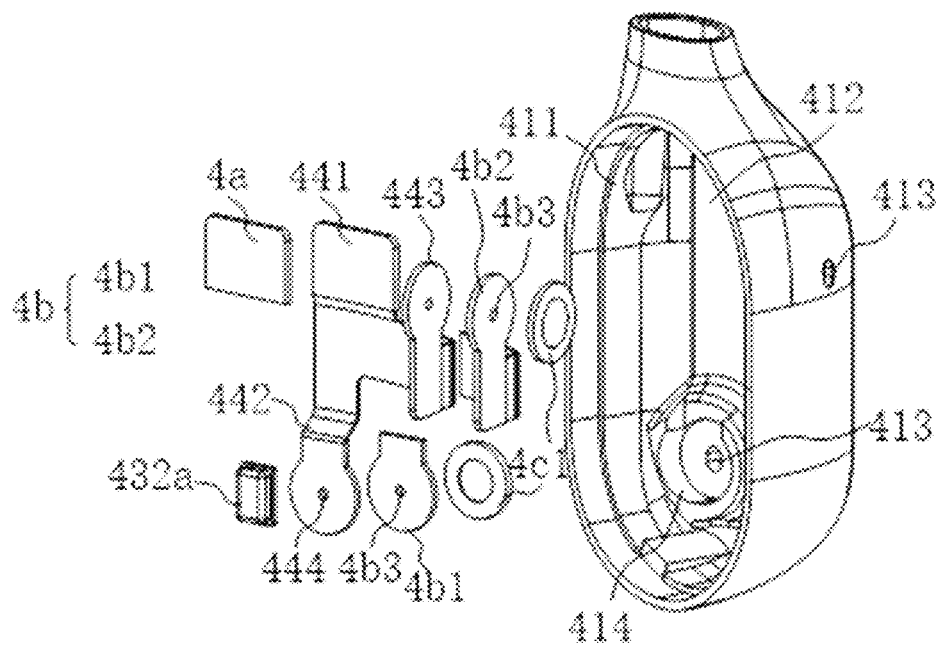
FIG. 3 is an exploded diagram illustrating a partial structure of a speaker according to some embodiments of the present disclosure.

In some embodiments, the flexible circuit board may be disposed with a number of pads. Different signal wires (e.g., audio signal wires, auxiliary signal wires) may be electrically connected to different pads through different flexible leads to avoid numerous and complicated internal wires issues, which may occur when both audio signal wires and auxiliary signal wires need to be connected to the earphone core or the auxiliary function module. FIG. 3 is an exploded diagram illustrating a partial structure of a speaker according to some embodiments of the present disclosure. As shown in FIGS. 2 and 3, a flexible circuit board 44 may at least include a number of first pads 45 and a number of second pads (not shown in the figures). In some embodiments, the flexible circuit board 44 in FIG. 2 may correspond to the flexible circuit board 106 in FIG. 1. At least one of the first pads 45 may be electrically connected to auxiliary function module(s). The at least one of the first pads 45 may be electrically connected to at least one of the second pads through a first flexible lead 47 on the flexible circuit board 44. The at least one of the second pads may be electrically connected to an earphone core (not shown in the figures) through external wire(s) (not shown in the figures). At least another one of the first pads 45 may be electrically connected to auxiliary signal wire(s). The at least another one of first pads 45 and the auxiliary function module(s) may be electrically connected through a second flexible lead 49 on the flexible circuit board 44. In the embodiment, the at least one of the first pads 45 may be electrically connected to the auxiliary function module(s). The at least one of the second pads may be electrically connected to the earphone core through the external wire(s). The one of the at least one of the first pads 45 may be electrically connected to one of the at least one of the second pads through the first flexible lead 47, so that the external audio signal wire(s) and the auxiliary signal wire(s) may be electrically connected to the earphone core and the auxiliary function modules at the same time through the flexible circuit board, which may simplify a layout of the wiring.

In some embodiments, the audio signal wire(s) may be wire(s) electrically connected to the earphone core and transmitting audio signal(s) to the earphone core. The auxiliary signal wire(s) may be wire(s) electrically connected to the auxiliary function modules and performing signal transmission with the auxiliary function modules.

In some embodiments, referring to FIG. 2, specifically, the flexible circuit board 44 may be disposed with the number of pads 45 and two pads (not shown in the figure). The two pads and the number of pads 45 may be located on the same side of the flexible circuit board 44 and spaced apart. The two pads may be connected to two corresponding pads 45 of the number of pads 45 through the flexible lead(s) 47 on the flexible circuit board 44. Further, a core housing 41 may also accommodate two external wires. One end of each of the external wires may be welded to the corresponding pad, and the other end may be connected to the earphone core, so that the earphone core may be connected to the pads through the external wires. The auxiliary function modules may be mounted on the flexible circuit board 44 and connected to other pads of the number of pads 45 through the flexible lead(s) 49 on the flexible circuit board 44.

In some embodiments, wires may be disposed in the fixing mechanism 110 of the speaker 100. The wires may at least include the audio signal wire(s) and the auxiliary signal wire(s). In some embodiments, there may be multiple wires in the fixing mechanism 110. Such wires may include at least two audio signal wires and at least two auxiliary signal wires. For example, the fixing mechanism 110 may be an eyeglass rim. The eyeglass rim may be connected to the core housing 41, and the wires may be wires disposed in the eyeglass rim. One end of each of multiple wires in the eyeglass rims may be welded to the flexible circuit board 44 arranged in the core housing 10, or a control circuit board, and the other end of the wire may enter the core housing 41 and be welded to the pad 45 on the flexible circuit board 44.

As used herein, one end of each of the two audio signal wires of the multiple wires in the eyeglass rims, which may be located in the core housing 41, may be welded to the two pads 45 by two flexible leads 47, and the other end may be directly or indirectly connected to the control circuit board. The two pads 45 may be further connected to the earphone core through the welding of the flexible lead(s) 49 and the two pad 46 and the welding of the two external wires and the pads, thereby transmitting the audio signal(s) to the earphone core.

One end of each of at least two auxiliary signal wires in the core housing 41 may be welded to the pad 45 by the flexible lead(s) 49, and the other end may be directly or indirectly connected to the control circuit board so as to pass the auxiliary signal(s) received and transformed by the auxiliary function module(s) to the control circuit (not shown in the figure).

In the approach described above, the flexible circuit board 44 may be disposed in the core housing 41, and the corresponding pads may be further disposed on the flexible circuit board 44. Therefore, the wires (not shown in the figure) may enter the core housing 41 and be welded to the corresponding pads, and further connected to the corresponding auxiliary function module(s) through the flexible leads 47 and the flexible leads 49 on the pads, thereby avoiding a number of wires directly connected to the auxiliary function module(s) to make the wiring in the core housing 41 complicated. Therefore, the arrangement of the wirings may be optimized, and the space occupied by the core housing 41 may be saved. In addition, when a number of the rim wires are directly connected to the auxiliary function module(s), a middle portion of the rim wires may be suspended in the core housing 41 to easily cause vibration, thereby resulting in abnormal sounds to affect the sound quality of the earphone core. According to the approach, the wires in the eyeglass rim may be welded to the flexible circuit board 44 and further connected to the corresponding auxiliary function module(s), which may reduce a situation that the wires are suspended from effecting the quality of the earphone core, thereby improving the sound quality of the earphone core to a certain extent.

In some embodiments, the flexible circuit board (also referred to as the flexible circuit board 44) may be further divided. The flexible circuit board may be divided into at least two regions. One auxiliary function module may be disposed on one of the at least two regions, so that at least two auxiliary function modules may be disposed on the flexible circuit board. Wiring between the audio signal wire(s) and the auxiliary signal wire(s) and the at least two auxiliary function modules may be implemented through the flexible circuit board. In some embodiments, the flexible circuit board may include at least a main circuit board and a first branch circuit board. The first branch circuit board may be connected to the main circuit board and extend away from the main circuit board along one end of the main circuit board. The auxiliary function module(s) may include at least a first auxiliary function module and a second auxiliary function module. The first auxiliary function module may be disposed on the main circuit board, and the second auxiliary function module may be disposed on the first branch circuit board. The number of first pads may be disposed on the main circuit board, and the second pads may be disposed on the first branch circuit board. In some embodiments, the first auxiliary function module may be a key switch. The key switch may be disposed on the main circuit board, and the first pads may be disposed corresponding to the key switch. The second auxiliary function module may be a microphone. The microphone may be disposed on the first branch circuit board, and the second pads corresponding to the microphone may be disposed on the first branch circuit board. The first pads corresponding to the key switch on the main circuit board may be connected to the second pads corresponding to the microphone on the first branch circuit board through the second flexible lead(s). The key switch may be electrically connected to the microphone, so that the key switch may control or operate the microphone.

In some embodiments, the flexible circuit board may further include a second branch circuit board. The second branch circuit board may be connected to the main circuit board. The second branch circuit board may extend away from the main circuit board along the other end of the main circuit board and be spaced from the first branch circuit board. The auxiliary function module(s) may further include a third auxiliary function module. The third auxiliary function module may be disposed on the second branch circuit board. The number of first pads may be disposed on the main circuit board. At least one of the second pads may be disposed on the first branch circuit board, and the other second pads may be disposed on the second branch circuit. In some embodiments, the third auxiliary function module may be a second microphone. The second branch circuit board may extend perpendicular to the main circuit board. The second microphone may be mounted on the end of the second branch circuit board away from the main circuit board. The number of pads may be disposed at the end of the main circuit board away from the second branch circuit board.

Specifically, as shown in FIG. 2 and FIG. 3, the second auxiliary function module may be the first microphone 432*a*. The third auxiliary function module may be the second microphone 432*b*. As used herein, the first microphone 432*a* and the second microphone 432*b* may both be MEMS (micro-electromechanical system) microphone 432, which may have a small working current, relatively stable performance, and high voice quality. The two microphones 432 may be disposed at different positions of the flexible circuit board 44 according to actual needs.

As used herein, the flexible circuit board 44 may include a main circuit board 441 (or referred to the main circuit board), and a branch circuit board 442 (or referred to the first branch circuit board) and a branch circuit board 443 (or referred to the second branch circuit board) connected to the main circuit board 441. The branch circuit board 442 may extend in the same direction as the main circuit board 441. The first microphone 432*a* may be mounted on one end of the branch circuit board 442 away from the main circuit board 441. The branch circuit board 443 may extend perpendicular to the main circuit board 441. The second microphone 432*b* may be mounted on one end of the branch circuit board 443 away from the main circuit board 441. A number of pads 45 may be disposed on the end of the main circuit board 441 away from the branch circuit board 442 and the branch circuit board 443.

In one embodiment, the core housing 41 may include a peripheral side wall 411 and a bottom end wall 412 connected to one end surface of the peripheral side wall 411, so as to form an accommodation space with an open end. As used herein, an earphone core may be disposed in the accommodation space through the open end. The first microphone 432a may be fixed on the bottom end wall 412. The second microphone 432b may be fixed on the peripheral side wall 411.

In the embodiment, the branch circuit board 442 and/or the branch circuit board 443 may be appropriately bent to suit a position of a sound inlet corresponding to the microphone 432 on the core housing 41. Specifically, the flexible circuit board 44 may be disposed in the core housing 41 in a manner that the main circuit board 441 is parallel to the bottom end wall 412. Therefore, the first microphone 432a may correspond to the bottom end wall 412 without bending the main circuit board 441. Since the second microphone 432b may be fixed on the peripheral side wall 411 of the core housing 41, it may be necessary to bend the second main circuit board 441. Specifically, the branch circuit board 443 may be bent at one end away from the main circuit board 441 so that a board surface of the branch circuit board 443 may be perpendicular to a board surface of the main circuit board 441 and the branch circuit board 442. Further, the second microphone 432b may be fixed at the peripheral side wall 411 of the core housing 41 in a direction facing away from the main circuit board 441 and the branch circuit board 442.

In one embodiment, the first pads 45, the second pads, the first microphone 432a, and the second microphone 432b may be disposed on the same side of the flexible circuit board 44. The second pads may be disposed adjacent to the second microphone 432b.

As used herein, the second pads may be specifically disposed at one end of the branch circuit board 443 away from the main circuit board 441 and have the same direction as the second microphone 432b and disposed at intervals. Therefore, the second pads may be perpendicular to the direction of the first pads 45 as the branch circuit board 443 is bent. It should be noted that the branch circuit board 443 may not be perpendicular to the board surface of the main circuit board 441 after being bent, which may be determined according to the arrangement between the side wall 411 and the bottom end wall 412.

Further, another side of the flexible circuit board 44 may be disposed with a rigid support plate 4a and a microphone rigid support plate 4b for supporting the first pads 45. The microphone rigid support plate 4b may include a rigid support plate 4b1 for supporting the first microphone 432a and a rigid support plate 4b2 for supporting the second pads and the second microphone 432b together.

As used herein, the rigid support plate 4a, the rigid support plate 4b1, and the rigid support plate 4b2 may be mainly used to support the corresponding pads and the microphone 432, and thus may need to have certain strengths. The materials of the three may be the same or different. The specific material may be polyimide (PI), or other materials that may provide the strengths, such as polycarbonate, polyvinyl chloride, etc. In addition, the thicknesses of the three rigid support plates may be set according to the strengths of the rigid support plates, and actual strengths required by the first pads 45, the second pads, the first microphone 432a, and the second microphone 432b, and be not specifically limited herein.

As used herein, the rigid support plate 4a, the rigid support plate 4b1, and the rigid support plate 4b2 may be three different regions of an entire rigid support plate, or three independent bodies spaced apart from each other, and be not specifically limited herein.

In one embodiment, the first microphone 432a and the second microphone 432b may correspond to two microphone components 4c, respectively (not shown in the figure). In one embodiment, the structures of the two microphone components may be the same. A sound inlet 413 may be disposed on the core housing 41. Further, the loud speaking device may be further disposed with an annular blocking wall 414 integrally formed on the inner surface of the core housing 41 at the core housing 41, and disposed at the periphery of the sound inlet 413, thereby defining an accommodation space (not shown in the figure) connected to the sound inlet 413.

In one embodiment, the flexible circuit board 44 may be disposed between a rigid support plate (e.g., the rigid support plate 4a, the rigid support plate 4b1, and the rigid support plate 4b2) and the microphone 432. A sound input 444 may be disposed at a position corresponding to a sound input 4b3 of the microphone rigid support plate 4b.

Further, the flexible circuit board 44 may further extend away from the microphone 432, so as to be connected to other functional components or wires to implement corresponding functions. Correspondingly, the microphone rigid support plate 4b may also extend out a distance with the flexible circuit board in a direction away from the microphone 432.

Correspondingly, the annular blocking wall 414 may be disposed with a gap matching the shape of the flexible circuit board to allow the flexible circuit board to extend out of the accommodation space 415. In addition, the gap may be further filled with a sealant to further improve the sealing.

Figure 4:
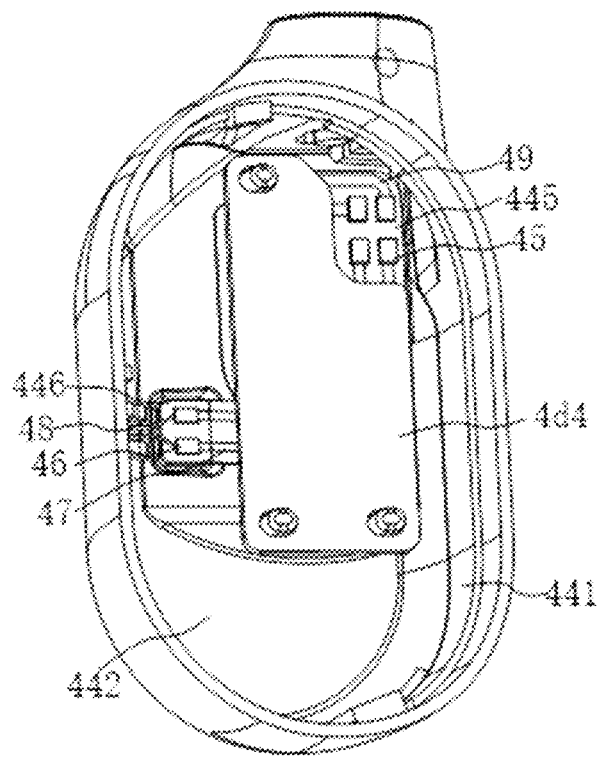
FIG. 4 is a partial sectional view illustrating a structure of a speaker according to some embodiments of the present disclosure.

FIG. 4 is a partial sectional view illustrating a structure of a speaker according to some embodiments of the present disclosure. In some embodiments, as shown in FIG. 4, the flexible circuit board 44 may include a main circuit board 445 and a branch circuit board 446. The branch circuit board 446 may extend along an extending direction perpendicular to the main circuit board 445. As used herein, the number of first pads 45 may be disposed at the end of the main circuit board 445 away from the branch circuit board 446. A key switch may be mounted on the main circuit board 445. The second pads 46 may be disposed at the end of the branch circuit boards 446 away from the main circuit board 445. The first auxiliary function module may be a key switch 431. The second auxiliary function module may be a microphone 432.

In the embodiment, a board surface of the flexible circuit board 44 and the bottom end wall 412 may be disposed in parallel and at intervals, so that the key switch may be disposed towards the bottom end wall 412 of the core housing 41.

As described above, an earphone core (or the earphone core 102) may include a magnetic circuit component, a vibration component, an external wire, and a bracket. As used herein, the vibration component may include a coil and an inner lead. The external wire may transmit an audio current to the coil in the vibration component. One end of the external wire may be connected to the inner lead of the earphone core, and the other end may be connected to the flexible circuit board of a speaker. The bracket may have a wiring groove. At least a portion of the external wire and/or the inner lead may be disposed in the wiring groove. In some embodiments, the inner lead and the outer wire may be welded to each other. A welding position may be located in the wiring groove.

Figure 5:
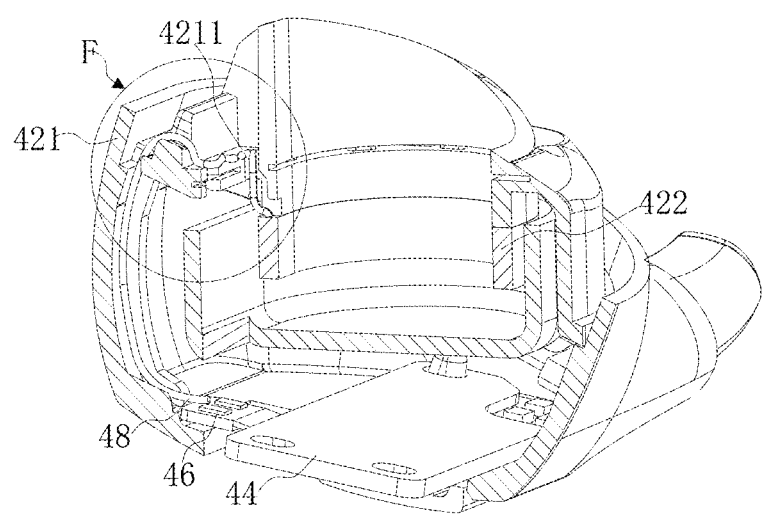
FIG. 5 is a partial sectional diagram illustrating a speaker according to some embodiments of the present disclosure.
Figure 6:
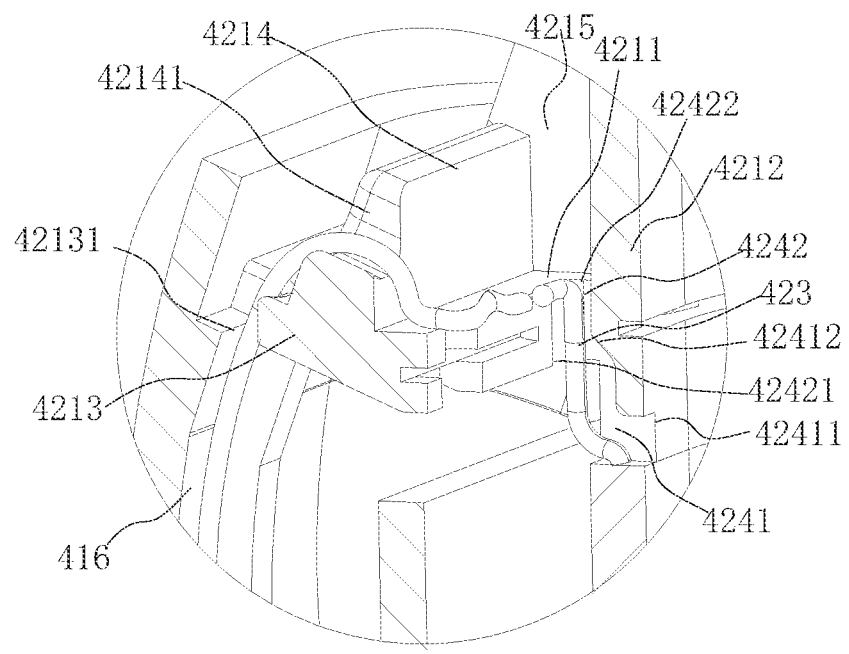
FIG. 6 is a partial enlarged diagram illustrating part F of a speaker in FIG. 5 according to some embodiments of the present disclosure.

FIG. 5 is a partial sectional diagram illustrating a speaker according to some embodiments of the present disclosure. FIG. 6 is a partial enlarged diagram illustrating part F of a speaker in FIG. 5 according to some embodiments of the present disclosure. Specifically, referring to FIG. 5 and FIG. 6, an earphone core may include a bracket 421, a coil 422, and an external wire 48. The bracket 421 may be used to support and protect the entire structure of the earphone core. In the embodiment, the bracket 421 may be disposed with a wiring groove 4211 used to accommodate a circuit of the earphone core.

The coil 422 may be disposed on the bracket 421 and have at least one inner lead 423. One end of the inner lead(s) 423 may be connected to a main circuit in the coil 422 to lead out the main circuit and transmit an audio current to the coil 422 through the inner lead 423.

One end of the external wire 48 may be connected to the inner lead(s) 423. Further, the other end of the external wire 48 may be connected to a control circuit (not shown in the figure) to transmit the audio current through the control circuit to the coil 422 through the inner lead 423.

Specifically, during an assembly stage, the external wire 48 and the inner lead(s) 423 may need to be connected together by means of welding, or the like. Due to structural and other factors, after the welding is completed, a length of the wire may not be exactly the same as a length of a channel, and there may be an excess length part of the wire. And if the excess length part of the wire is not disposed reasonably, it may vibrate with the vibration of the coil 422, thereby making an abnormal sound and affecting the sound quality of the earphone core.

Further, at least one of the external wire 48 and the inner lead 423 may be wound and disposed in the wiring groove 4211. In an application scenario, the welding position between the inner lead 423 and the external wire 48 may be disposed in the wiring groove 4211, so that a portion of the external wire 48 and the inner lead 423 located near the welding position may be wound in the wiring groove 4211. In addition, in order to maintain stability, the wiring groove 4211 may be further filled with a sealant to further fix the wiring in the wiring groove 4211.

In the manner described above, the wiring groove 4211 may be disposed on the bracket 421, so that at least one of the external wire 48 and the inner lead 423 may be wound into the wiring groove 4211 to accommodate the excess length part of the wire, thereby reducing the vibration generated inside the channel, and reducing the influence of the abnormal sound caused by the vibration on the sound quality of the earphone core.

In one embodiment, the bracket 421 may include an annular main body 4212, a support flange 4213, and an outer blocking wall 4214. As used herein, the annular main body 4212, the support flange 4213, and the outer blocking wall 4214 may be integrally formed.

As used herein, the annular main body 4212 may be disposed inside the entire bracket 421 and used to support the coil 422. Specifically, a cross-section of the annular main body 4212 in a direction perpendicular to the radial direction of a ring of the annular main body 4212 may be consistent with the coil 422. The coil 422 may be disposed at an end of the annular main body 4212 facing the core housing. The inner side wall and the outer side wall of the annular main body 4212 may be flush with the inner side wall and the outer side wall of the coil 422, respectively, so that the inner side wall of the coil 422 and the inner side wall of the annular main body 4212 may be coplanar, and the outer side wall of the coil 422 and the outer side wall of the annular main body 4212 may be coplanar.

Further, the support flange 4213 may protrude on the outer side wall of the annular main body 4212 and extend along the outside of the annular main body 4212. Specifically, the support flange 4213 may extend outward in a direction perpendicular to the outer side wall of the annular main body 4212. As used herein, the support flange 4213 may be disposed at a position between two ends of the annular main body 4212. In the embodiment, the support flange 4213 may protrude around the outer side wall of the annular main body 4212 to form an annular support flange 4213. In other embodiments, the support flange 4213 may also be formed by protruding at a portion of the outer side wall of the annular main body 4212 according to needs.

The outer blocking wall 4214 may be connected to the support flange 4213 and spaced apart from the annular main body 4212 along the side of the annular main body 4212. As used herein, the outer blocking wall 4214 may be sleeved on the periphery of the annular main body 4212 and/or the coil 422 at intervals. Specifically, the outer blocking wall 4214 may be partially sleeved around the periphery of the annular main body 4212 and the coil 422 according to actual needs, or partially sleeved around the periphery of the annular main body 4212. It should be noted that, in the embodiment, a portion of the outer blocking wall 4214 close to the wiring groove 4211 may be sleeved on a portion of the periphery of the annular main body 4212. Specifically, the outer blocking wall 4214 may be disposed on a side of the support flange 4213 away from the core housing. As used herein, the outer side wall of the annular main body 4212, the side wall of the support flange 4213 away from the core housing, and the inner side wall of the outer blocking wall 4214 may together define the wiring groove 4211.

In one embodiment, a wiring channel 424 may be disposed on the annular main body 4212 and the support flange 4213. The inner lead(s) 423 may extend inside the wiring groove 4211 via the wiring channel 424.

As used herein, the wiring channel 424 may include a sub-wiring channel 4241 on the annular main body 4212 and a sub-wiring channel 4242 on the support flange 4213. The sub-wiring channel 4241 may be disposed through the inner side wall and the outer side wall of the annular main body 4212. A wiring port 42411 communicating with one end of the sub-wiring channel 4241 may be disposed on a side of the annular main body 4212 near the coil 422. A wiring port 42412 communicating with the other end of the sub-wiring channel 4241 may be disposed on a side of the core housing near the support flange 4213 facing the core housing. The sub-wiring channel 4242 may penetrate the support flange 4213 in a direction towards the outside of the core housing. The wiring port 42421 communicating with the end of the sub-wiring channel 4242 may be disposed on a side of the support flange 4213 facing the core housing. The wiring port 42422 communicating with the other end of the sub-wiring channel 4242 may be disposed on a side away from the core housing. As used herein, the wiring port 42412 and the wiring port 42421 may communicate through a space between the support flange 4213 and the annular main body 4212.

Further, the inner lead(s) 423 may enter the wiring port 42411, extend along the sub-wiring channel 4241, exit from the wiring port 42412 to enter a region between the annular main body 4212 and the support flange 4213, further enter the sub-wiring channel 4242 from the wiring port 42421, and extend into the wiring groove 4211 after passing through the wiring port 42422.

In one embodiment, the top of the outer blocking wall 4214 may be disposed with a slot 42141. The external wire 48 may extend inside the wiring groove 4211 through the slot 42141.

As used herein, one end of the external wire 48 may be disposed on the flexible circuit board 44. The flexible circuit board 44 may be specifically disposed on an inner side of the earphone core facing the core housing.

In the embodiment, the support flange 4213 may be further extended to a side of the outer blocking wall 4214 away from the annular main body 4212 to form an outer edge. Further, the outer edge may surround and abut on the inner side wall of the core housing. Specifically, the outer edge of the support flange 4213 may be disposed with a slot 42131, so that the external wire 48 on the inner side of the earphone core facing the core housing may be extended to the outer side of the support flange 4213 facing the core housing through the slot 42131, and then to the slot 42141, and enter the wiring groove 4211 through the slot 42141.

Further, the inner side wall of the core housing may be disposed with a guide groove 416. One end of the guide groove 41 may be located on one side of the flexible circuit board 44 and the other end may communicate with the slot 42131 and extend in a direction towards the outside of the core housing, so that the external wire 48 extends from the flexible circuit board to a second wiring groove 3331 by passing through the guide slot 416.

In one embodiment, the bracket 421 may further include two side blocking walls 4215 spaced along the circumferential direction of the annular main body 4212 and connected to the annular main body 4212, the supporting flange 4213, and the outer blocking wall 4214, thereby defining the wiring groove 4211 between the two side blocking walls 4215.

Specifically, the two side blocking walls 4215 may be oppositely disposed on the support flange 4213 and protrude towards the outer side of the core housing along the support flange 4213. As used herein, a side of the two side blocking walls 4215 facing the annular main body 4212 may be connected to the outer side wall of the annular main body 4212. A side away from the annular main body 4212 may terminate at the outer side wall of the outer blocking wall 4214. The wiring port 42422 and the slot 42141 may be defined between the two side blocking walls 4215. Therefore, the inner lead(s) 423 exiting from the wiring port 42422 and the outer wire 48 entering through the slot 42141 may extend into the wiring groove 4211 defined by the two side blocking walls 4215.

Figure 7:
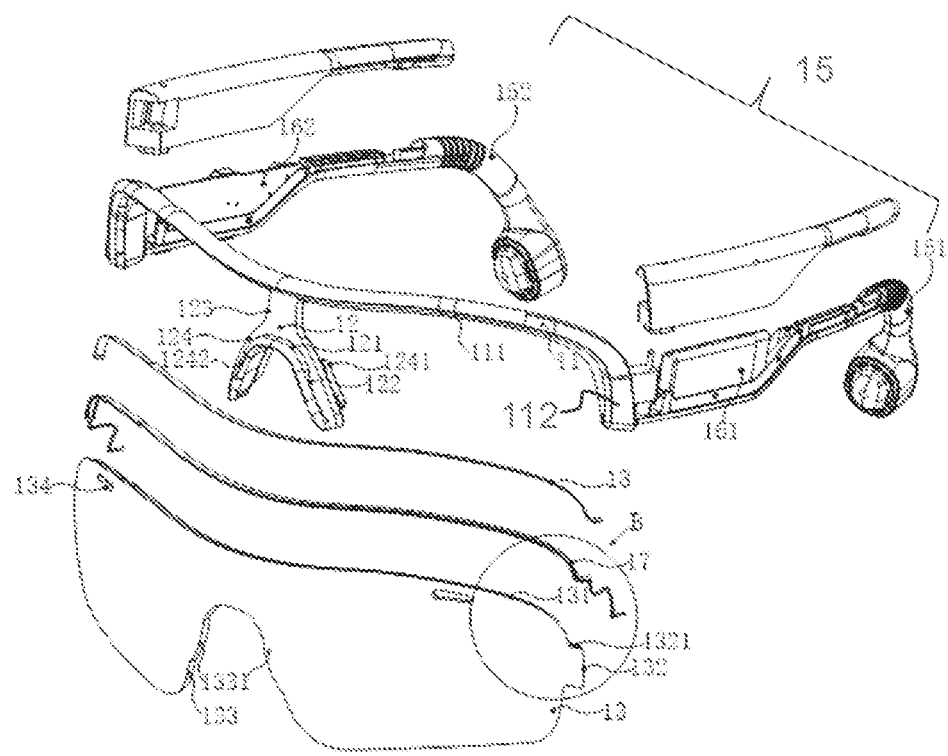
FIG. 7 is an exploded view illustrating a speaker according to some embodiments of the present disclosure.

FIG. 7 is a schematic diagram illustrating a structure of a speaker according to some embodiments of the present disclosure.

In some embodiments, the speaker may be eyeglasses. In some embodiments, a fixing mechanism may be an eyeglass frame. The fixing mechanism may have at least one rotating shaft. The rotating shaft(s) may be used to connect an eyeglass rim and an eyeglass temple. The eyeglass rim and the eyeglass temple may rotate around the rotating shaft. The rotating shaft may have a rotating shaft wiring channel disposed along an axis. A connection wire may be disposed in the fixing mechanism. The connection wire may be an electrical connection wire. The connection wire may pass through the rotating shaft wiring channel. Two ends of the connection wire may extend into the eyeglass rim and the eyeglass temple, respectively. In some embodiments, the eyeglass temple at two sides may accommodate a control circuit and a battery component, respectively. The connection wire in the eyeglass rim may be electrically connect to the control circuit and the battery component. The connection wire may include an audio signal wire and an auxiliary signal wire. The connection wire may be electrically connected to a flexible circuit board (i.e., the flexible circuit board 106) in a core housing (i.e., the core housing 108), and electrically connected to an earphone core (i.e., the earphone core 102) and auxiliary function module(s) (i.e., an auxiliary function module 104) through the flexible circuit board.

In some embodiments, the eyeglasses of the present disclosure may be eyeglasses worn in people's daily life and at work to correct vision and protect eyes, or certain circuit structures and electronic components may be added into the eyeglasses in order to further implement specific functions through the circuit structures and electronic components. Specifically, the eyeglasses in the present disclosure may be smart eyeglasses, virtual reality eyeglasses, holographic eyeglasses, augmented reality eyeglasses, or eyeglasses with other functional structures (e.g., eyeglasses with a bone conduction earphone or an air conduction earphone).

In some embodiments, as shown in FIG. 7, the eyeglass frame may include an eyeglass rim 11, a nose pad 12, a spectacle lens 13, and an eyeglass temple 15.

As used herein, the eyeglass rim 11 may be used to carry at least a portion of the spectacle lens 13. The nose pad 12 may be used to support the eyeglasses on the bridge of the nose of a user when the user wears the eyeglasses.

The nose pad 12 may be disposed in the middle of the eyeglass rim 11 and integrally formed with the eyeglass rim 11. In the prior art, the eyeglass rim 11 and the nose pad 12 may be usually formed, respectively. The middle portion of the eyeglass rim 11 may be disposed with a structure connected to the nose pad 12. After molding, the nose pad 12 may be installed on the connection structure of the eyeglass rim 11. In the embodiment, the eyeglass rim 11 and the nose pad 12 may be integrally formed directly. Specifically, a corresponding mold may be used to implement the integral molding, for example, injection molding, or the like. In the embodiment, the eyeglass rim 11 and the nose pad 12 may not need to be further installed after the molding, thereby simplifying a manufacturing process of eyeglasses.

In addition, the spectacle lens 13 may also be integrally designed, and be fixed by the eyeglass rim 11 and the nose pad 12 in a clamping manner.

Further, the eyeglass rim 11 and the nose pad 12 may be respectively disposed with a structure for clamping the spectacle lens 13. When the eyeglasses are assembled, the integrally designed spectacle lens 13 may be directly clamped to the integrally formed eyeglass rim 11 and nose pad 12 through the corresponding clamping structures.

In the embodiment, the eyeglass rim 11 and the nose pad 12 may be integrally formed, and the spectacle lens 13 may also be integrally designed. Therefore, the entire structure of the eyeglasses may be simple, and the manufacturing process of the eyeglasses may be simplified.

Referring to FIG. 7, FIG. 7 is an exploded view illustrating the eyeglasses according to an embodiment of the present disclosure. In the embodiment, the spectacle lens 13 may include a top-side edge 131 and two outer edges 132 connected to both ends of the top-side edge 131 and disposed away from the nose pad 12. Each of the outer edges 132 may be respectively disposed with a first buckle 1321. The eyeglass rim 11 may be disposed with a first mounting groove 111 for receiving the top-side edge 131 and at least a portion of the outer edges 132, and a first buckle groove 112 for receiving the first buckle 1321 and communicating with the first mounting groove 111.

As used herein, when the eyeglasses are in a wearing state, the top-side edge 131 may be located on the upper side of the spectacle lens 13, the outer edge may be located on both sides of the spectacle lens 13 near ears of the user, and the top-side edge 131 and the two outer edges 132 may be connected to each other. The first mounting groove 111 may be disposed on a side of the eyeglass rim 11 facing the spectacle lens 13. A size of the first mounting groove 111 may match the top-side edge 131 and the two outer edges 132 of the corresponding spectacle lens 13, so that the spectacle lens 13 may be mounted on the eyeglass rim 11 by mounting the top-side edge 131 and at least the portion of the outer edge 132 in the first mounting groove 111.

Further, the first buckle 1321 may be formed by further extending at least a portion of the outer edge 131 of the spectacle lens 13 toward two sides away from the nose pad 12. The first buckle groove 112 may be formed by recessing a position of the first mounting groove 111 corresponding to the first buckling 1321 in a direction away from the spectacle lens 13. As used herein, the shape and size of the first buckle groove 112 may match the first buckle 1321, so that the spectacle lens 13 may be further installed on the eyeglass rim 11 by clamping the first buckle 1321 into the first buckle groove 112.

It should be noted that at least a portion of the outer edge 132 may be located on the side of the first buckle 1321 away from the top-side edge 131, so that the first buckle 1321 and a portion of the spectacle lens 13 near the two sides of the edge of the spectacle lens 13 may be accommodated inside the first mounting groove 111. Therefore, the spectacle lens 13 may be more firmly fixed on the eyeglass rim 11.

In one embodiment, the spectacle lens 13 may further include an inner edge 133 abutting on the nose pad 12. The nose pad 12 may be disposed with a second mounting groove 121 for receiving the inner edge 133.

It should be noted that the spectacle lens 13 may include a left spectacle lens and a right spectacle lens. The inner edge 133 of the spectacle lens 13 may be disposed at a connection between the left spectacle lens and the right spectacle lens and a vicinity of the connection. Accordingly, the second mounting groove 121 and the first mounting groove 111 may be oppositely disposed so that the opposite sides of the spectacle lens 13 may be respectively received and fixed in an accommodation space formed by the eyeglass rim 11 and the nose pad 12.

In one embodiment, two sides of the inner edge 133 may be respectively disposed with a second buckle 1331. The nose pad 12 may be further disposed with a second buckle groove 122 connected to the second mounting groove 121 and used to receive the second buckle 1331.

As used herein, the inner edge 133 may include two portions connected to each other, which may be respectively disposed on a side of the left eyeglass lens facing the right eyeglass lens and a side of the right eyeglass lens facing the left eyeglass lens. The nose pad 12 may also be divided into two portions, which may be respectively supported on the left and right nose bridges of the user when worn by the user. Accordingly, in the embodiment, the count of the second buckle groove 122 and the second buckle 1331 may also be two. The shape and size of the second buckle 1331 may match the corresponding second buckle groove 122 to install the second buckle 1331 in the corresponding second buckle groove 122.

In addition, the spectacle lens 13 may be disposed with the inner edge 133 near both sides of the second buckle 1331, which may allow the vicinity of both sides of the second buckle 1331 to be installed in the second mounting groove 121. Therefore, the spectacle lens 13 may be more firmly fixed on the nose pad 12.

By the approach, the spectacle lens 13 may be respectively mounted on the eyeglass rim 11 and the nose pad 12 through the top-side edge 131, the outer edge 132, the inner edge 133, the first buckle 1321, and the second buckle 1331.

In an application scenario, the spectacle lens 13 may be further disposed with vent holes 134. Specifically, the count of the vent holes may be two, and respectively disposed on the left and right sides of the spectacle lenses 13 near the top-side edge 131. The arrangement of the vent holes 134 may facilitate air circulation of the inner and outer sides of the spectacle lens 13 when the user wears the eyeglasses, thereby reducing a phenomenon of fogging of the spectacle lens 13 caused by local overheating due to reasons such as user movement, etc.

Figure 8:
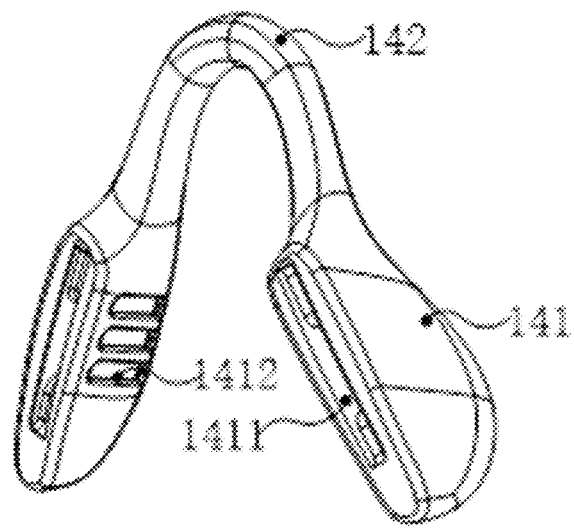
FIG. 8 is a schematic diagram illustrating a structure of a nose pad cover in a speaker according to some embodiments of the present disclosure.

Specifically, referring to FIG. 7 and FIG. 8 together, FIG. 7 is an exploded view illustrating a speaker according to some embodiments of the present disclosure, and FIG. 8 is a schematic diagram illustrating a structure of a nose pad cover of eyeglasses according to some embodiments of the present disclosure. In one embodiment, the nose pad 12 may include a connection portion 123 connected to the eyeglass rim 11 on the side of the first mounting groove 111 near the user or away from the user in the wearing state, and two support portions 124 connected to the connection portion 123 in an inverted Y-shaped manner on a side of the connection portion 123 away from the eyeglass rim 11. The support portions 124 may be used to support the eyeglasses on the nose of the user when wearing.

In an application scenario, the connecting portion 123 may be integrally connected to the eyeglass rim 11. When the user wears the eyeglasses, the connecting portion 123 may be disposed on a side of the first mounting groove 111 close to the user.

A side of each of the support portions 124 protruding toward the nose bridge of the user may be disposed with I-shaped hook(s) 1241. The eyeglasses may further include nose pad cover(s) 14 detachably sleeved on the hook(s) 1241.

As used herein, the nose pad cover 14 may be made of soft rubber. Specifically, the count of the I-shaped hook(s) 1241 may be two, corresponding to the left and right nose bridges of the user, respectively. The nose pad cover 14 may include two cover bodies 141 and a connecting portion 142 connecting to the two cover bodies 141. As used herein, the connecting portion 142 may be connected with the nose bridge of the user. The cover bodies 141 may be correspondingly disposed with I-shaped accommodation groove(s) 1411 matching the hook(s) 1241. Sides of the cover bodies 141 facing the nose bridge of the user may further be disposed with an anti-slippery portion 1412 including a number of grooves. In the embodiment, the nose pad cover 14 may be detachably disposed, thereby facilitating cleaning and replacement of the nose pad cover 14.

Further, in an embodiment, sides of the two support portions 124 back from the hook(s) 1241 may be protruded with strip shaped ribs 1242. The strip shaped ribs 1242 may cooperate with the two support portions 124 to form the second mounting groove 121 and the second buckle groove 122.

As used herein, the strip shaped ribs 1242 may be protruded along edges of the two support portions 124 away from the spectacle lens 13, thereby forming the second mounting groove 121 for receiving the inner edge 133 of the spectacle lens 13. At a position corresponding to the second buckle 1331 of the spectacle lens 13, the strip shaped ribs 1242 may be further recessed to form the second buckle groove 122.

Referring to FIG. 7 together, in one embodiment, the eyeglass rim may further include the eyeglass temple 15, function component(s) 16, and a connection wire 17. As used herein, the eyeglass temple 15 may include a first eyeglass temple 151 and a second eyeglass temple 152. The function component(s) 16 may include a first function component 161 and a second function component 162.

Specifically, the first eyeglass temple 151 and the second eyeglass temple 152 may be respectively connected to the eyeglass rim 11. The first function component 161 and the second function component 162 may be respectively disposed on the first eyeglass temple 151 and the second eyeglass temple 152. At least one cavity may be disposed on the two eyeglass temples 15 to accommodate the corresponding function components 16.

The connection wire 17 may be disposed inside the first mounting groove 111 and between the bottom of the first mounting groove 111 and the top-side edge 131 of the spectacle lens 13, and further extend to the first eyeglass temple 151 and the second eyeglass temple 152 to be electrically connected to the first function component 161 and the second function component 162.

In the embodiment, the function component(s) 16 respectively disposed in the two eyeglass temples 15 may need to be electrically connected through the connection wire 17 so that the eyeglasses may implement a specific function. Specifically, in an application scenario, the first function component 161 may be a battery component, and the second function component 162 may be a control circuit component. The control circuit component may be connected to the battery component through the connection wire 17, so that the battery component may provide power to the control circuit component. Therefore, the control circuit component may implement the specific function.

In order to meet requirements of beauty and lightness of the eyeglasses, the connection wire 17 may be disposed in the first mounting groove 111 along the top-side edge 131 of the spectacle lens 13 and accommodated inside a space formed by the first mounting groove 111 and the top-side edge 131 of the spectacle lens 13, so that the connection wire 17 may be neither exposed on the outer surface of the eyeglasses nor occupy extra space. In an application scenario, the connection wire 17 may further extend along the outer edge 132 of the spectacle lens 13 inside the first mounting groove 111.

Specifically, the eyeglass rim 11, the first eyeglass temple 151, and the second eyeglass temple 152 may respectively be disposed with a wiring channel communicated with each other, so that the connection wire 17 may enter the first eyeglass temple 151 and the second eyeglass temple 152 from the first mounting groove 111 of the eyeglass rim 11 through the corresponding wiring channels, thereby connecting the first function component 161 and the second function component 162.

In the embodiment, the connection wire 17 may have an electrical connection function. In other embodiments, the connection wire 17 may also have a mechanical connection function.

In the embodiment, the first function component 161 and the second function component 162 may be respectively disposed on the first eyeglass temple 151 and the second eyeglass temple 152. The connection wire 17 electrically connecting the first function component 161 and the second function component 162 may be disposed inside the first mounting groove 111 on the eyeglass rim 11 to receive the top-side edge 131 of the spectacle lens 13, so that the connection wire 17 may be disposed between the bottom of the first mounting groove 111 and the top-side edge 131 of the spectacle lens, and further extend to the first eyeglass temple 151 and the second eyeglass temple 152. Therefore, the connection wire 17 may not be exposed, and extra space may not need for the arrangement of the connection wire 17, so that the beauty and lightness of the eyeglasses may be maintained.

Figure 9:
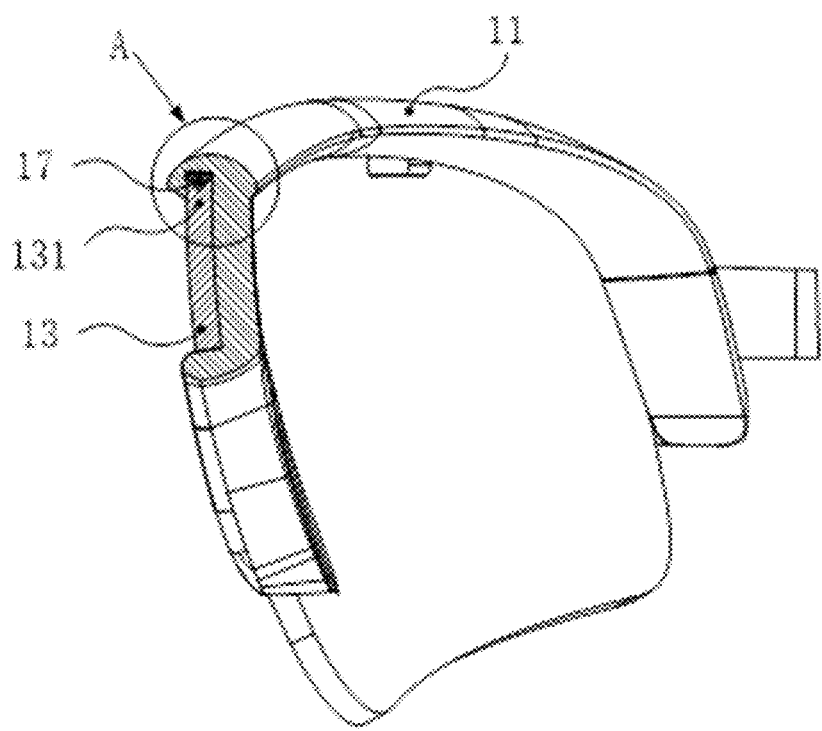
FIG. 9 is a partial sectional view illustrating an eyeglass rim and a spectacle lens in a speaker according to some embodiments of the present disclosure.
Figure 10:
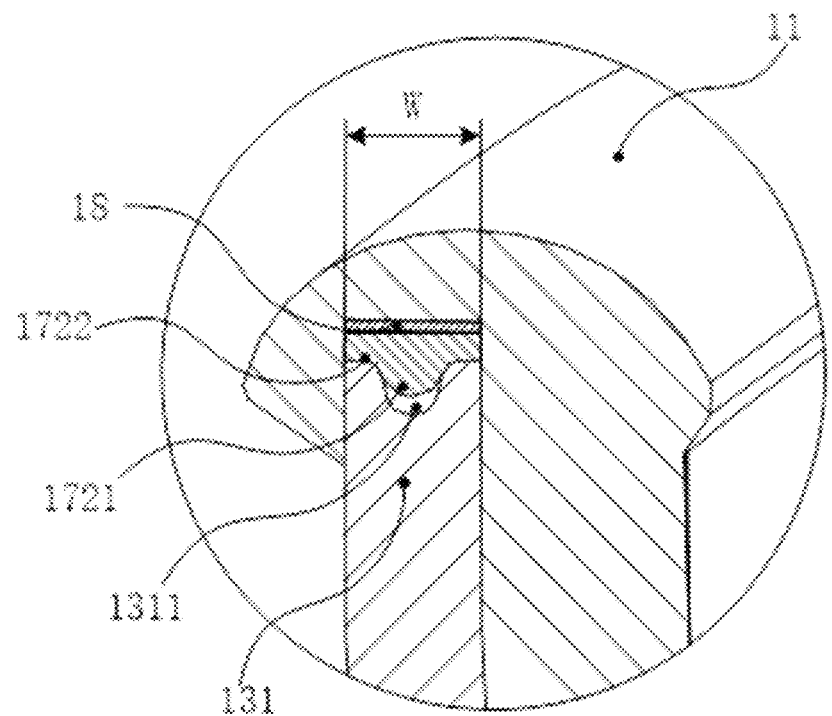
FIG. 10 is an enlarged view illustrating part A of a speaker in FIG. 9 according to some embodiments of the present disclosure.
Figure 11:
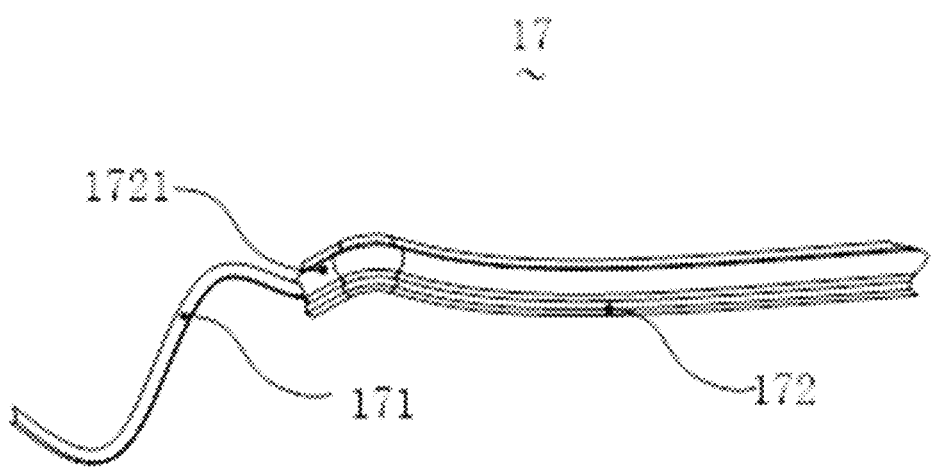
FIG. 11 is a partial structural diagram illustrating a connection wire in a speaker according to some embodiments of the present disclosure.

Referring to FIG. 9, FIG. 10, and FIG. 11 together, FIG. 9 is a partial sectional view illustrating an eyeglass rim and a spectacle lens according to an embodiment of the present disclosure, FIG. 10 is an enlarged view illustrating part A in FIG. 9, and FIG. 11 is a partial structural diagram illustrating a connection wire according to an embodiment of the present disclosure. In the embodiment, the connection wire 17 may include a wire body 171 and a wire protection cover 172 wrapped around the periphery of the wire body 171. A sectional shape of the wire protection cover 172 may match a sectional shape of the first mounting groove 111, so that the wire protection cover 172 may be held in the first mounting groove 111 in a surface contact manner.

As used herein, the wire protection cover 172 may be made of soft rubber, so that the connection wire 17 may be bent to match the shape of the first mounting groove 111. It may be easy to understand that the wire body 171 may be thin. If the wire body 171 is directly installed in the first mounting groove 111, a contact area with the bottom of the first mounting groove 111 may be small, and it is difficult to be firmly fixed therein. In the embodiment, the wire protection cover 172 may be further wrapped around the periphery of the wire body 171, which, on the one hand, may play a role of protecting the wire body 171, and, on the other hand, increase the contact area between the connection wire 17 and the first mounting groove 111 by adjusting the surface area of the wire protection cover 172 to reliably fix the wire body 171 inside the first mounting groove 111.

Further, the sectional shape of the first mounting groove 111 may be a shape to allow the wire protection cover 172 to be held in the first mounting groove 111 with a large area of surface contact. For example, the shape may be U-shaped, rectangular, or wavy, and be not specifically limited herein. Correspondingly, the shape of a side of the wire protection cover 172 facing the bottom of the first mounting groove 111 may correspond to the shape, so that the wire protection cover 172 may be directly or indirectly fitted to the bottom of the first mounting groove 111.

In an application scenario, further referring to FIG. 7, an adhesive layer 18 may be disposed between the wire protection cover 172 and the eyeglass rim 11, so that the wire protection cover 172 may be fixed in the first mounting groove 111 through the adhesive layer 18.

As used herein, the adhesive layer 18 may be disposed on the bottom of the first mounting groove 111, or further extended to both sides and disposed on a side wall near the bottom of the first mounting groove 111, thereby making the adhesive layer 18 to wrap around the wire protection cover 172 to more firmly fix the connection wire 17 inside the first mounting groove 111.

Specifically, in the application scenario, a section of the first mounting groove 111 may be rectangular. The bottom of the first mounting groove 111 and a side of the wire protection cover 172 facing the bottom of the first mounting groove 111 may be both flat, and the adhesive layer 18 may be a double-sided adhesive layer disposed therebetween.

Further, in one embodiment, a side of the wire protection cover 172 facing the top-side edge 131 of the eyeglass lens 13 may be disposed with a convex portion 1721 corresponding to the wire body 171. The top-side edge 131 of the spectacle lens 13 may be disposed with a clearance slot 1311 for receiving the convex portion 1721.

Specifically, the section of the wire body 171 may be circular. The wire protection cover 172 may be flush with the wire body 171 on the side of the wire body 171 facing the bottom of the first mounting groove 111. The side of the wire body 171 facing away from the bottom of the first mounting groove 111 may still present the shape of the wire body 171, thereby forming the corresponding convex portion 1721.

Further, the top-side edge 131 of the spectacle lens 13 may need to be further disposed inside the first mounting groove 111. In the embodiment, the top-side edge 131 may be further disposed with the clearance slot 1311 for receiving the convex portion 1721, so that the connection wire 17 installed inside the first mounting groove 111 may be at least partially accommodated in the clearance slot 1311 corresponding to the top-side edge 131.

Further, the convex portion 1721 may be located in a middle region of the wire protection cover 172 along a width direction of the wire protection cover 172 to form abutting portions 1722 on two sides of the convex portion 1721. The two abutting portions 1722 may abut on the top-side edges 131 on two sides of the clearance slot 1311, respectively. As used herein, the width direction of the wire protection cover 172 may refer to a direction perpendicular to a direction of the wire protection cover 172 along the first mounting groove 111, specifically a direction indicated by W in FIG. 10.

It may be easy to understand that the depth of the first mounting groove 111 may be limited. If the top-side edge 131 of the spectacle lens 13 is flush with the convex portion 1721 of the connection wire 17, or a side of the wire protection cover 172 and the wire body 171 facing away from the bottom of the first mounting groove 111 is flush with the wire body 171, an insertion depth of the top-side edge 131 of the spectacle lens 13 in the first mounting groove 111 may be reduced, which may disadvantage the stable installation of the spectacle lens 13 in the eyeglass rim 11. In the embodiment, the top-side edge 131 of the spectacle lens 13 may avoid a portion of the connection wire 17 through the clearance slot 1311, so that the top-side edge 131 may further extend towards the bottom of the first mounting groove 111 relative to the clearance slot 1311 and abut on the abutting portions 1722 on the two sides of the protruding portion 1721. Therefore, the space occupied by the connection wire 17 in the first mounting groove 111 may be reduced to a certain extent, so that the spectacle lens 13 may be installed deeper inside the first mounting groove 111, thereby improving the stability of the spectacle lens 13 in the eyeglass rim 11.

In an application scenario, the eyeglass rim 11 may be thin, and at least a portion of the convex portion 1721 may be exposed outside the first mounting groove 111 to reduce the space of the eyeglass rim occupied by the connection wire 17, thereby reducing the depth of the first mounting groove 111 and improving the stability of the eyeglass rim 11.

Figure 12:
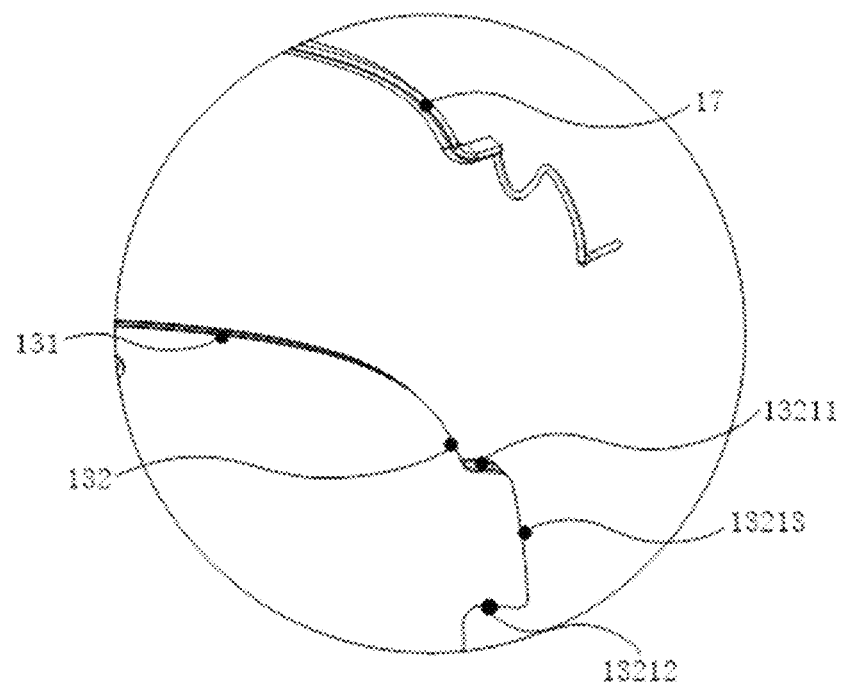
FIG. 12 is a partial structural schematic diagram illustrating part B of a speaker in FIG. 7 according to some embodiments of the present disclosure.

As used herein, further referring to FIG. 2 and FIG. 12, FIG. 12 is a partial structural diagram illustrating part B in FIG. 7 according to some embodiments of the present disclosure. In one embodiment, the first buckle 1321 may include a first sub-edge 13211, a second sub-edge 13212, and a third sub-edge 13213.

As used herein, the first sub-edge 13211 may be disposed adjacent to the top-side edge 131. The second sub-edge 13212 may be disposed away from the top-side edge 131 and opposite to the first sub-edge 13211. The third sub-edge 13213 may be connected to the first sub-edge 13211 and the second sub-edge 13212 on a side of the first sub-edge 13211 and the second sub-edge 13212 away from the spectacle lens 13.

In the embodiment, the wire protection cover 172 may further extend to the first buckle groove 112 along the first sub-edge 13211.

In the way, the wire protection cover 172 may be held in the first mounting groove 111 and extend to the first buckle groove 112 to be hidden in the eyeglass rim 11. Therefore, when a user disassembles the spectacle lens 13 during use, the wire protection cover 172 may not be exposed after the spectacle lens 13 is disassembled to maintain the beauty of the eyeglasses.

Further, when extending towards the first buckle groove 112, the wire protection cover 172 may end at a connection between the first sub-edge 13211 and the third sub-edge 13213. Certainly, the wire protection cover 172 may also not end and continue to extend along the wire body 171, as long as the wire protection cover 172 is not exposed when the spectacle lens 13 is disassembled.

Figure 13:
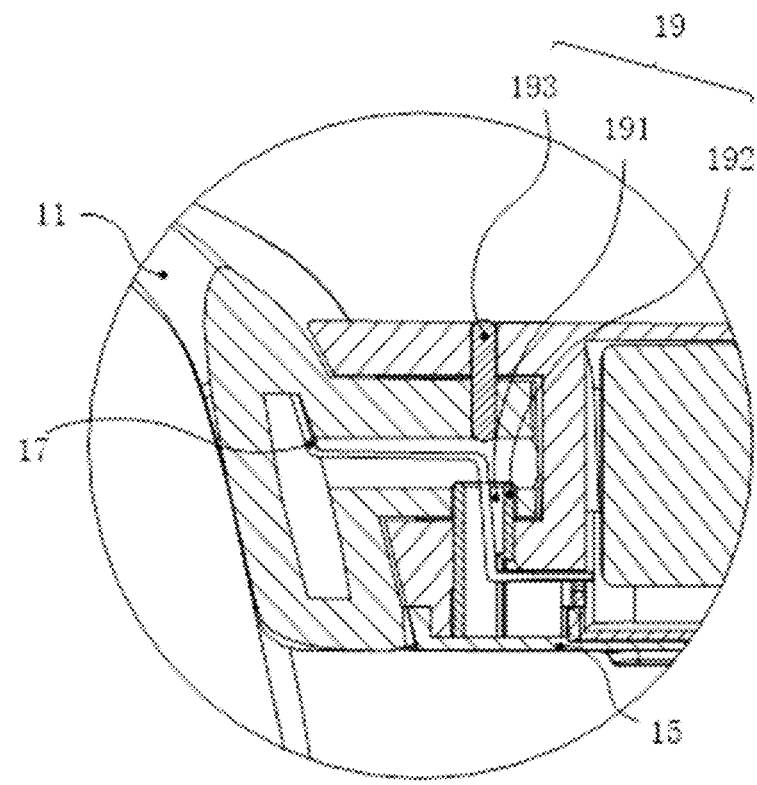
FIG. 13 is an enlarged sectional view illustrating a partial structure of eyeglasses in a speaker according to some embodiments of the present disclosure.

Referring to FIG. 13 together, FIG. 13 is an enlarged sectional view illustrating a partial structure of eyeglasses according to an embodiment of the present disclosure. In the embodiment, the eyeglasses may further include rotating shaft(s) 19.

As used herein, the count of the rotating shaft(s) 19 may be two, and be respectively used to connect the eyeglass rim 11 and the two eyeglass temples 15 so that the eyeglass rim 11 and the eyeglass temples 15 may rotate relative to the rotating shaft 19. As used herein, the rotating shaft 19 may be disposed with a rotating shaft wiring channel 191 in an axial direction. The connection wire 17 may be disposed inside the shaft wiring channel 191 and extend to the eyeglass rim 11 and the eyeglass temples 15, respectively.

Specifically, in the embodiment, after the connection wire 17 passes through the rotating shaft wiring channel 191, one end of the connection wire 17 may extend directly to one of the eyeglass temples 15, and the other end of the connection wire 17 may enter the eyeglass rim 11 and further extend to another one of the eyeglass temples 15 along the first mounting groove 111, thereby electrically connecting the two function components 16 located inside the two eyeglass temples 15, respectively.

In the embodiment, the connection wire 17 near the rotating shaft wiring channel may not include the wire protection cover 172. The rotating shaft wiring channel 191 may pass through the rotating shaft 19.

It may be easy to understand that relative positions of structures near the rotating shaft 19 may change when the eyeglass rim 11 and the eyeglass temple 15 are folded. At this time, if the connection wire 17 located at the connection between the eyeglass rim 11 and the eyeglass temple 15 is directly disposed around the periphery of the rotating shaft 19, the connection wire 17 herein may be compressed or pulled, even deformed or broken with the folding of eyeglass rim 11 or eyeglass temples 15, which may affect the stability of the connection wire 17 and shorten the service life of the connection wire 17.

In the embodiment, the rotating shaft 19 may be disposed with the shaft wiring channel 191 along the axial direction. The connection wire 17 located at the connection between the eyeglass rim 11 and the eyeglass temple 15 may pass through the shaft wiring channel 191. Therefore, when the eyeglass rim 11 and the eyeglass temple 15 are folded, the connection wire 17 located inside the rotating shaft wiring channel 191 may only generate a certain amount of rotation with the rotation of the rotating shaft 19 to reduce the folding, compressing or pulling of the connection wire 17, thereby protecting the connection wire 17 to a certain extent, improving the stability of the connection wire 17, and extending the service life of the connection wire 17.

As used herein, in the embodiment, an inner diameter of the rotation shaft wiring channel 191 may be larger than an outer diameter of the connection wire 17. For example, the inner diameter of the shaft wiring channel 191 may be twice the outer diameter of the connection wire 17. Accordingly, a binding effect of the inner side wall of the axis wiring channel 191 on the connection wire 17 may be reduced, thereby reducing the rotation of the connection wire 17 when the eyeglass rim 11 and the eyeglass temple 15 are folded.

Figure 14:
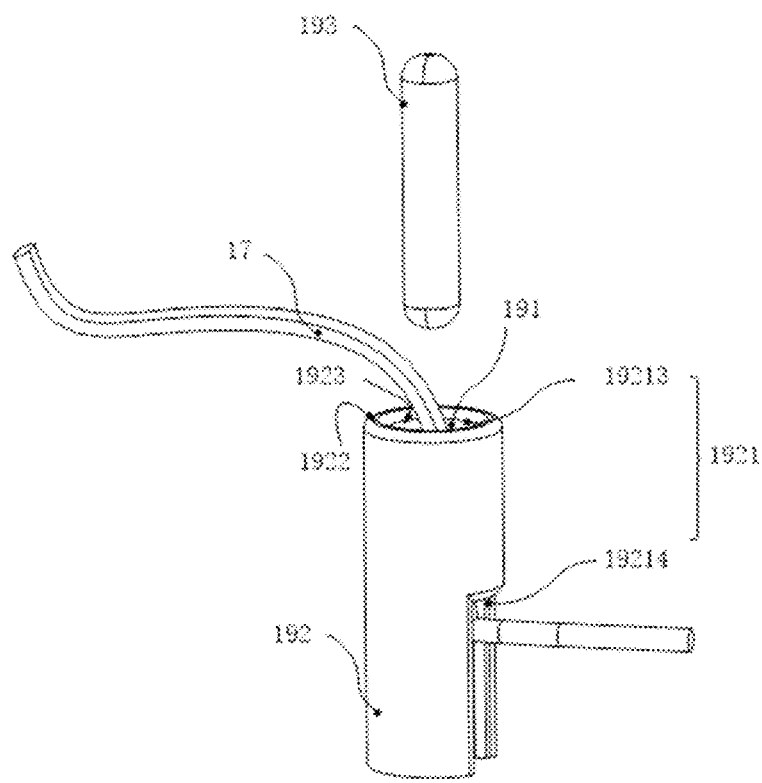
FIG. 14 is a schematic structural diagram illustrating a rotating shaft component and a connection wire in a speaker according to some embodiments of the present disclosure.

Referring to FIG. 13 and FIG. 14 together, FIG. 14 is a schematic structural diagram illustrating a rotating shaft and a connection wire of eyeglasses according to an embodiment of the present disclosure. In the embodiment, the rotating shaft 19 may include a first rotating shaft 192. Two ends of the first rotating shaft 192 may be respectively connected to the eyeglass rim 11 and the eyeglass temple 15. The rotating shaft wiring channel 191 may be disposed along an axial direction of the first rotating shaft 192. The shaft wiring channel 191 may communicate with the outside through a wiring port 1921 disposed on at least one end surface of the first rotating shaft 192. The connection wire 17 may extend to the eyeglass rim 11 or the eyeglass temples 15 through the wiring port 1921.

It should be noted that, in the embodiment, the first rotating shaft 192 may be rotatably connected to one of the eyeglass rim 11 and the eyeglass temples 15, and fixedly connected to another, so that the eyeglass rim 11 and the eyeglass temples 15 may be rotatably connected around the first rotating shaft 192.

Specifically, in the embodiment, the rotating shaft wiring channel 191 may be disposed inside the first rotating shaft 192, and further communicate with the outside through the wiring port 1921.

Specifically, the rotating shaft wiring channel 191 may penetrate at least one end surface of the first rotating shaft 192 to form the wiring port 1921 of the rotating shaft wiring channel 191. Therefore, the connection wire 17 may extend from the shaft wiring channel 191 through the at least one end surface of the first rotating shaft 192, and then extend to the eyeglass rim 11 or the eyeglass temples 15. It may be easy to understand that the periphery of the end surface of the first rotating shaft 192 may have a relatively large movement space. The connection wire 17 extending from the end surface of the first rotating shaft 192 may be accommodated inside the movement space. And if the first rotating shaft 192 at the end face is rotatably connected to the corresponding eyeglass rim 11 or eyeglass temple 15, when the eyeglass rim 11 and the eyeglass temple 15 fold and rotate, the movement space may be appropriately buffered a twist of the connection wire 17 near the wiring port 1921 on the end surface with the rotation of the first rotating shaft 192, thereby further reducing the twisting degree of the connection wire 17 and improving the stability of connection wire 17.

Figure 15:
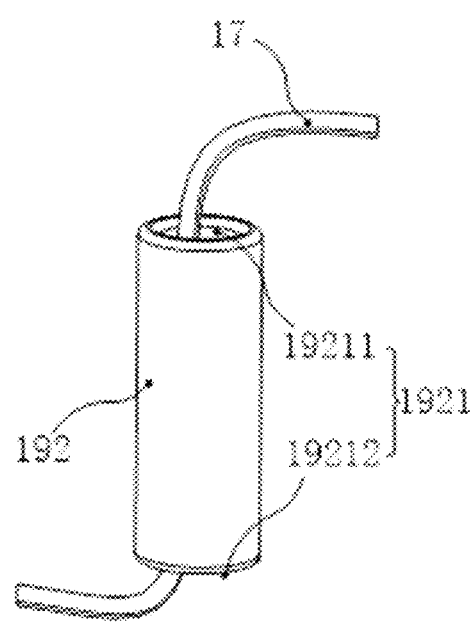
FIG. 15 is a schematic structural diagram illustrating a first rotating shaft in a speaker according to some embodiments of the present disclosure.

Referring to FIG. 15, FIG. 15 is a schematic structural diagram illustrating a first rotating shaft of eyeglasses according to an embodiment of the present disclosure. In the embodiment, the wiring port 1921 may include a first wiring port 19211 and a second wiring port 19212 respectively disposed on two ends of the first rotating shaft 192. The rotating shaft wiring channel 191 may communicate with the outside through the two wiring ports 1921, so that the connection wire 17 may pass through the two ends of the first rotating shaft 192 and extend to the eyeglass rim 11 and the eyeglass temple 15 through the first wiring port 19211 and the second wiring port 19212, respectively.

In other words, in the application scenario, the connection wire 17 at the connection between the eyeglass rim 11 and the eyeglass temple 15 may be disposed inside the rotating shaft wiring channel 191 in the first rotating shaft 192, and extend from the rotating shaft wiring channel 191 through the two ends of the first rotating shaft 192, respectively. At this time, since large movement spaces exist on the periphery of two end surfaces of the first rotating shaft 192, the connection wire 17 extending from the two end surfaces of the first rotating shaft 192 may only move or twist slightly without compressing or deforming when the relative rotation occurs between the eyeglass rim 11 and the eyeglass temple 15.

Referring to FIG. 14, in the embodiment, the wiring port 1921 may include a first wiring port 19213 and a second wiring port 19214. As used herein, the first wiring port 19213 may be disposed on an end surface of the first rotating shaft 192, and the second wiring port 19214 may be disposed on a side wall of the first rotating shaft 192. Therefore, one end of the shaft wiring channel 191 may penetrate the end surface of the first rotating shaft 192 in the axial direction through the first wiring port 19213, and the other end may penetrate the side wall of the first rotating shaft 192 through the second wiring port 19214, and then communicate with the outside. The connection wire 17 may extend to the eyeglass rim 11 and the eyeglass temple 15 through the first wiring port 19213 and the second wiring port 19214, respectively.

Similarly, a large movement space may be disposed near the end face of the first rotating shaft 192 of the first wiring port 19213. When a relative movement occurs between the eyeglass rim 11 and the eyeglass temple 15, the connection wire 17 near the first wiring port 19213 may only undergo a relative shift, or a small twist.

In an application scenario, the first rotating shaft 192 may be fixedly connected to one of the eyeglass rim 11 and the eyeglass temple 15 disposed near the second wiring port 19214, and rotatably connected to another of the eyeglass rim 11 and the eyeglass temple 15 disposed near the first wiring port 19213. That is, the first rotating shaft 192 may be rotatably connected to one of the eyeglass rim 11 or the eyeglass temple 15 at the wiring port 1921 disposed on the end surface. The first rotating shaft 192 may be fixedly connected to another of the eyeglass rim 11 or the eyeglass temple 15 at the wiring port 1921 disposed on the side wall.

In an application scenario, the first rotating shaft 192 may be closed to the eyeglass rim 11 at the first wiring port 19213, and rotatably connected to the eyeglass rim 11. The first rotating shaft 192 may be closed to the eyeglass temple 15 at the second wiring port 19214, and fixedly connected to the eyeglass temple 15.

It should be noted that, in this application scenario, the first rotating shaft 192 is rotatably connected to the eyeglass rim 11, and the relative rotation between the eyeglass rim 11 and the eyeglass temple 15 may cause the relative movement of the connection wire 17 at the first wiring 19213. However, since the first wiring port 19213 is disposed on the end surface of the first rotating shaft 192, similar to the embodiment described above, the end surface of the first rotating shaft 192 may have a large movement space. When the eyeglass rim 11 and the eyeglass temple 15 are folded and rotated, and the connection wire 17 near the wiring port 1921 on the end surface is twisted to a certain extent with the rotation of the first rotating shaft 192, the movement space may be appropriately buffered, and the twist may be turned into a shift or a small twist, without compressing or pulling the connection wire, thereby improving the stability of the connection wire and extending the service life of the connection wire.

In addition, the first rotating shaft 192 may be fixedly connected to the eyeglass temple 15 at the second wiring port 19214. It may be easy to understand that the eyeglass temple 11 and the first rotating shaft 192 may be synchronized when the relative rotation occurs between the eyeglass rim 11 and the eyeglass temple 15. Hence, the connection wire 17 in the shaft wiring channel 191 may extend through the second wiring port 19214 into the connection wire 17 of the eyeglass temple 11 without twisting, compressing, or pulling. Therefore, at this time, the second wiring port 19214 may be disposed on the end surface of the first rotating shaft 192 or on the side wall of the first rotating shaft 192. The relative rotation between eyeglass rim 11 and eyeglass temple 15 may not cause the twisting, compressing, pulling, etc., of the connection wire 17 herein.

In other embodiments, if the first rotating shaft 192 and the eyeglass temple 15 are rotatably connected at the second wiring port 19214, the relative rotation between thereof may allow the connection wire 17 to move, which may be constrained by the side wall of the first rotating shaft at the second wiring port 19214, so that the connection wire 17 may be compressed between the side wall of the first rotating shaft and the eyeglass temple 15.

If the first rotating shaft 192 is near the eyeglass temple 15 at the first wiring port 19213 and rotatably connected to the eyeglass temple 15, the first rotating shaft 192 may be near the eyeglass rim 11 at the second wiring port 19214 and fixedly connected to the eyeglass rim 11. For the same reason, when the eyeglass rim 11 and the eyeglass temple 15 are folded, the connection wire 17 inside the rotating shaft wiring channel 191 and near the first wiring port 19213 and the second wiring port 19214 may be still only slightly twisted or moved.

Referring to FIG. 14, in one embodiment, the rotating shaft 19 may further include a second shaft 193 coaxial with and spaced from the first rotating shaft 192.

In the embodiment, the second rotating shaft 193 may be disposed on a side of the first rotating shaft 192 near the first wiring port 19213. Certainly, in other embodiments, the second rotating shaft 193 may also be disposed on a side of the first rotating shaft 192 closed to the second wiring port 19214.

Figure 16:
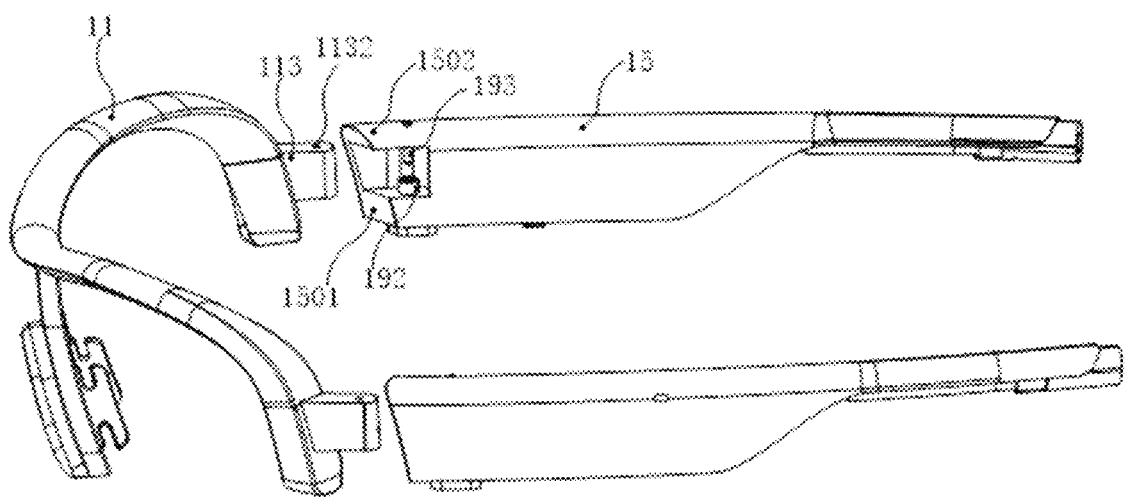
FIG. 16 is a partial exploded view illustrating a speaker according to some embodiments of the present disclosure.

Referring to FIG. 16, FIG. 16 is a partial exploded view illustrating eyeglasses according to an embodiment of the present disclosure. In the embodiment, the eyeglass rim 11 may include first lug(s) 113. Specifically, the count of the first lug(s) 113 may be two, and be respectively disposed at two ends of the eyeglass rim 11 connecting to the two eyeglass temples 15 and protrude towards the corresponding eyeglass temples 15.

The eyeglass temple 15 may include a second lug 1501 and a third lug 1502 disposed at intervals. As used herein, the second lug 1501 and the third lug 1502 may face ends of the eyeglass rim 11 connected to the eyeglass temple 15 at which the lugs are located. In addition, when the user wears the eyeglasses, the second lug 1501 and the third lug 1502 may be connected to a side away from the head of the user, thereby making the eyeglasses more overall and more beautiful in appearance. In an application scenario, the second lug 1501 and the third lug 1502 disposed at intervals may be formed by disposing a groove in the middle of an end of the eyeglass temple 15 facing the eyeglass rim 11.

Further, ends of the first rotating shaft 192 and the second rotating shaft 193 closed to each other may be connected to the first lug 113. Ends of the first rotating shaft 192 and the second rotating shaft 193 away from each other may be connected to the second lug 1501 and the third lug 1502, respectively, so as to maintain the first lug 113 between the second lug 1501 and the third lug 1502.

As used herein, referring to FIG. 14 continuously, in one embodiment, the first wiring port 19213 may be disposed on an end surface of the first rotating shaft 192 near the second rotating shaft 193. The second wiring port 19214 may be disposed on a side wall of the first rotating shaft near the second lug 1501. The first rotating shaft may be rotatably connected to the first lug 113 and fixedly connected to the second lug 1501.

Specifically, in the embodiment, one end of the connection wire 17 inside the rotating shaft wiring channel 191 may extend from the first wiring port 19213 and pass through an interval between the first rotating shaft 192 and the second rotating shaft 193. Further, in an application scenario, the first lug 113 may be disposed with a wiring channel connected to the first wiring port 19213, so that the connection wire 17 may further enter the eyeglass rim 11 from the first lug 113.

In addition, the other end of the connection wire 17 inside the rotating shaft wiring channel 191 may extend from the second wiring port 19214. Further, in an application scenario, the third lug 1502 may be disposed with a wiring channel communicating with the second wiring port 19214, so that the connection wire 17 may further enter the eyeglass temple 15 through the wiring channel of the third lug 1502.

As used herein, the second wiring port 19214 may be a through-hole disposed on a side wall of the first rotating shaft 192, and communicated with the rotating shaft wiring channel 191 without penetrating an end of the first rotating shaft 192. In the embodiment, the second wiring port 19214 may be further penetrated along the side wall of the first rotating shaft 192 to an end of the first rotating shaft 192 away from the first wiring port 19213. It may be easy to understand that, in the embodiment, the second wiring port 19214 may have a larger space. Therefore, when the connection wire 17 is moved for some reason, the restriction on the connection wire 17 may be further reduced, and the damage to the side wall of the first rotating shaft 192 may be further reduced.

Figure 17:
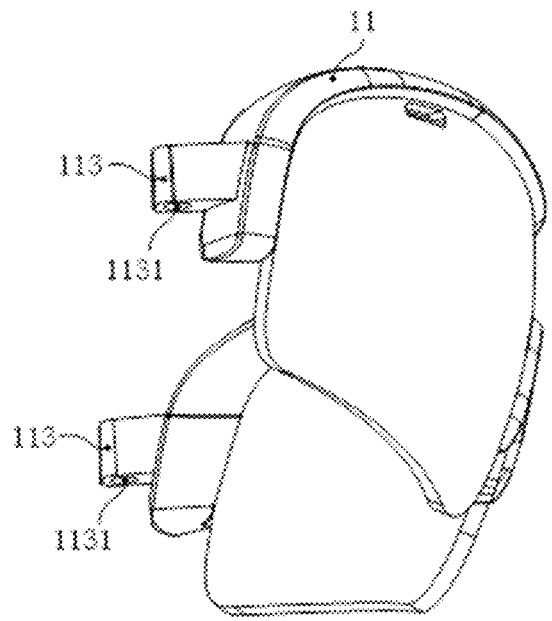
FIG. 17 is a schematic structural diagram illustrating an eyeglass rim and a spectacle lens in a speaker according to some embodiments of the present disclosure.
Figure 18:
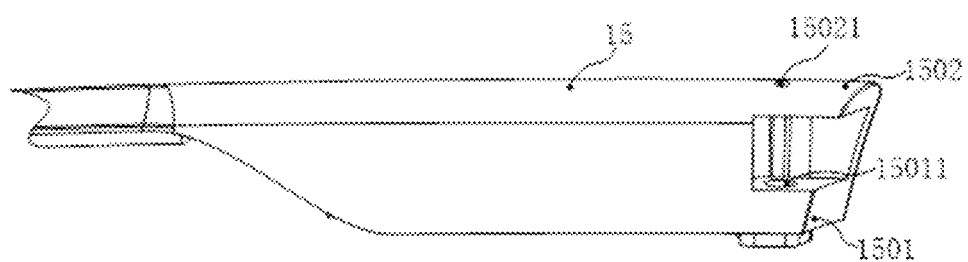
FIG. 18 is a schematic diagram illustrating a partial structure of an eyeglass temple in a speaker according to some embodiments of the present disclosure.

Referring to FIG. 16, FIG. 17, and FIG. 18 together, FIG. 17 is a schematic structural diagram illustrating an eyeglass rim and a spectacle lens of eyeglasses according to an embodiment of the present disclosure, and FIG. 18 is a partial structural schematic diagram illustrating an eyeglass temple of eyeglasses according to an embodiment of the present disclosures. In the embodiment, the first lug 113 and the second lug 1501 may be coaxially disposed with a first accommodating hole 1131 and a second accommodating hole 15011, respectively. Sizes of the first accommodating hole 1131 and the second accommodating hole 15011 may be set to allow the first rotating shaft 192 to be inserted into the first accommodating hole 1131 from the outside of the eyeglass temple 15 through the second accommodating hole 15011, such that the first rotating shaft 192 may be in an interference fit with the second accommodating hole 15011 and in a clearance fit with the first accommodating hole 1131.

Specifically, the second accommodating hole 15011 may be a through-hole penetrating the second lug 1501. The first accommodating hole 1131 may correspond to the second accommodating hole 15011 and penetrate at least a portion of the first lug 113. As used herein, an inner diameter of the first accommodating hole 1131 may be larger than the second accommodating hole 15011. An outer diameter of the first rotating shaft 192 may be between the first accommodating hole 1131 and the second accommodating hole

15011. Therefore, the first rotating shaft 192 may be fixedly connected to the eyeglass temple 15 and rotatably connected to the eyeglass rim 11 so that the eyeglass rim 11 and the eyeglass temple 15 may be rotated around the first rotating shaft 192 to be folded or unfolded.

Further, in an embodiment, the first lug 113 and the third lug 1502 may be coaxially disposed with a third accommodating hole 1132 and a fourth accommodating hole 15021, respectively. Sizes of the third accommodating hole 1132 and the fourth accommodating hole 15021 may be set to allow the second rotating shaft 193 to be inserted into the third accommodating hole 1132 from the outside of the eyeglass temple 15 via the fourth accommodating hole 15021, such that the second rotating shaft 193 may be in an interference fit with the third accommodating hole 1132 and in a clearance fit with the fourth accommodating hole 15021, or the second rotating shaft 193 may be in a clearance fit with the third accommodating hole 1132 and in an interference fit with the fourth accommodating hole 15021.

In the embodiment, the third accommodating hole 1132 and the fourth accommodating hole 15021 may be coaxial with both the first accommodating hole 1131 and the second accommodating hole 15011. As used herein, the third accommodating hole 1132 may penetrate at least a portion of the first lug 113. In one application scenario, the first accommodating hole 1131 and the third accommodating hole 1132 may be coaxially penetrated. Specifically, as described in the above embodiment, the first lug 113 of the eyeglass rim 11 may be disposed with a wiring channel connected to the first wiring port 19213. The first accommodating hole 1131 and the third accommodating hole 1132 may be respectively disposed on both sides of the wiring channel located inside the first lug 113 and both pass through the wiring channel. The fourth accommodating hole 15021 may penetrate the third lug 1502. As used herein, the outer diameter of the second rotating shaft 193 may be between the inner diameter of the third accommodating hole 1132 and the inner diameter of the fourth accommodating hole 15021. The inner diameter of the third accommodating hole 1132 may be larger than the fourth accommodating hole 15021. Alternatively, the inner diameter of the fourth accommodating hole 15021 may be larger than the third accommodating hole 1132. Therefore, the second rotating shaft 193 may be fixedly connected to the eyeglass temple 15 and rotatably connected to the eyeglass rim 11, or the second rotating shaft 193 may be fixedly connected to the eyeglass rim 11 and rotatably connected to the eyeglass temple 15, so that the eyeglass rim 11 and the eyeglass temple 15 may be rotated around the first rotating shaft 192 to be folded or unfolded.

In one embodiment, the second rotating shaft 193 may be a solid shaft, and the diameter may be less than that of the first rotating shaft 192. In the wearing state, the second shaft 193 may be located on the upper side of eyeglass temple 15, and the first rotating shaft may be located on the lower side of eyeglass temple 15.

It should be noted that, since the rotating shaft wiring channel 191 may be disposed inside the first rotating shaft 192, the outer diameter of the first rotating shaft 192 may be larger, which may adversely satisfy aesthetic needs of the user. Therefore, in the embodiment, the second rotating shaft 193 having a smaller outer diameter may be further disposed. Hence, when the user wears the eyeglasses, the second rotating shaft 193 may be disposed on an upper portion that is easily found, and the first rotating shaft 192 may be disposed on a lower portion that is not easily observed. Since the outer diameter of the second rotating shaft 193 is smaller, the overall aesthetic effect of the eyeglasses may be improved to a certain extent.

Certainly, in other embodiments, the first rotating shaft 192 and the second rotating shaft 193 may also be other cases. For example, the second rotating shaft 193 may also be a hollow shaft, and the diameter of the second rotating shaft 193 may be larger than the diameter of the first rotating shaft 192. Alternatively, in the wearing state, the second rotating shaft 193 may be disposed on a lower side of the eyeglass temple 15, and the first rotating shaft 192 may be disposed on an upper side of the eyeglass temple 15, or the like, and be not limited herein.

In addition, referring to FIG. 14, a connection between an end surface 1922 of the first rotating shaft 192 for disposing the first wiring port 19213 and an inner wall surface 1923 of the first rotating shaft 192 for defining the rotating shaft wiring channel 191 may be arc-shaped. It may be easy to understand that, when the rotation between the eyeglass rim 11 and the eyeglass temple 15 through the rotating shaft 19 occurs, since the first rotating shaft 192 and the eyeglass rim 11 are rotatably connected, the connection wire 17 at the first wiring port 19213 may be moved. In the embodiment, the connection between the end surface 1922 of the first rotating shaft 192 and the inner wall surface 1923 may be arc-shaped. Therefore, when the connection wire 17 at the first wiring port 19213 moves and contacts with the first rotating shaft 192, the connection wire 17 may be avoided to be cut if the connection is too sharp, thereby further protecting the connection wire 17.

In an application scenario, a connection between the end surface of the first rotating shaft 192 for disposing the second wiring port 19214 and the inner wall surface 1923 of the first rotating shaft 192 for defining the rotating shaft wiring channel 191 may also be arc-shaped. Similarly, in this way, the connection wire 17 may be further protected.

It should be noted that the above description of the rotating shaft and wiring in the eyeglasses may be only specific examples, and should be not considered as the only feasible implementation. Obviously, for those skilled in the art, after understanding the basic principle of the rotating shaft and wiring in the eyeglasses, it may be possible to make various modifications and changes in the form and details of the specific manner and operation of implementing the rotating shaft and wiring in the eyeglasses without departing from these principles, but these modifications and changes are still within the scope described above. For example, the branch circuit board may also include a third pad and a third flexible circuit board. All such variations may be within the protection scope of the present disclosure.

In some embodiments, as shown in FIG. 1, a speaker includes an earphone core 102 and a core housing 108. In an application scenario, the speaker of the eyeglasses may include, but is not limited to, a bone conduction speaker, an air conduction speaker. The following may further illustrate a fitting position on human body based on the bone conduction speaker. It should be known that without departing from the principles, the following illustrations may also be applied to the air conduction speaker.

In some embodiments, the position of the speaker relative to the eyeglass temple 15 may not be fixed. Specifically, the core housing 108 may be rotated to change the position of each speaker relative to the connected eyeglass temple 15, thus the speaker may fit on different parts of the user's body, and the user may adjust it based on his or her preferences. Due to the vibrations transmitted by different bones are different, users may feel different sound qualities, and it is also convenient for users with different sizes of head. For example, in FIG. 7, the speaker may be fixed on the ear by the eyeglass temple 15, and the speaker may be located behind the ear. In some embodiments, the connecting end of the eyeglass temple 15 and the speaker may be set according to a position that the user is accustomed to. For example, the speaker and the eyeglass temple 15 may be connected by hinged connection, if the user is used to placing the speaker behind the ear, the speaker may be set behind the ear by adjusting a hinge component. It should be noted that, the connection between the eyeglass temple 15 and the speaker 21 is not limited to the connection described above. For example, the eyeglass temple 15 and the speaker may also be connected by clamping. In some embodiments, the speaker may be fitted to any parts of the user's head, such as the top of the head, the forehead, cheeks, sideburns, auricles, the back of auricles, or the like. For example, a bracket spanning the top of the head may be arranged between the eyeglass temples 15 to reduce the supporting force of the nose bridge on the eyeglasses, and the speaker may be arranged on the bracket. In some embodiments, the way the bone conductive earphone fitted to the head may be surface fitted or point fitted. The contact surface may be arranged with a gradient structure, and the gradient structure refers to an area where the height of the contact surface changes. The gradient structure may include a convex/concave structure, a step-like structure, etc., on the outside of the contact surface (the side that is fitted to the user), or on the inside of the contact surface (the side facing away from the user).

It should be noted that the above illustration of the fitting position of the speaker is only a specific example and should not be regarded as the only feasible implementation solution. Obviously, for those skilled in the art, after understanding the basic principles of fitting, it is possible to make various modifications and changes in forms and details to the specific methods and steps of fitting without departing from the principles, but the modifications and changes are still within the scope illustrated above. For example, the position of clamping may be adjusted based on the fitting part of the speaker and the head. Such deformations are all within the protection scope of the present disclosure.

Figure 19:
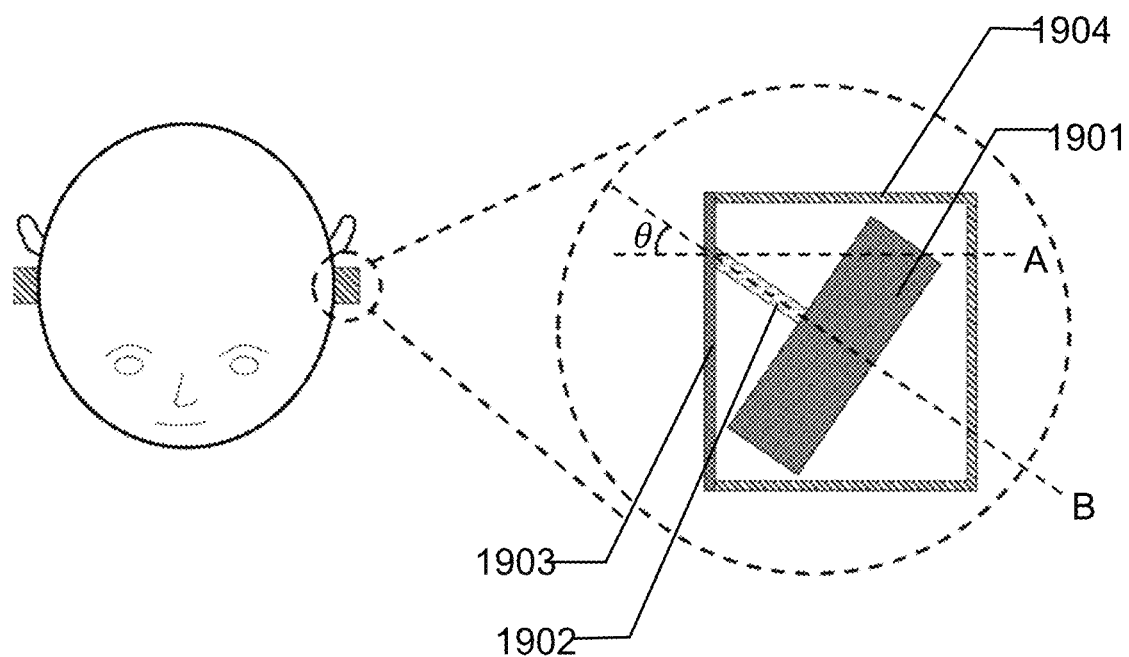
FIG. 19 is a structural diagram and an application scenario of a bone conduction speaker according to some embodiments of the present disclosure.

FIG. 19 is a structural diagram and an application scenario of a bone conduction speaker according to some embodiments of the present disclosure. Referring to FIG. 1 and FIG. 19, the structural diagram in FIG. 19 illustrating a speaker including the earphone core 102 and the core housing 108 in FIG. 1. The following only takes the bone conduction speaker as an example to illustrate the application scenario and structure of the speaker. In some embodiments, as shown in FIG. 19, the bone conduction speaker may include a driving component 1901, a transmission component 1902, a panel 1903 (the panel 1903 may also be referred to as a housing panel, which is a panel on the core housing facing human), a housing 1904, or the like. Referring to FIG. 1, the panel 1903 and the housing 1904 are consistent with the core housing (shown in FIG. 1). The driving component 1901 and the transmission component 1902 are consistent with the earphone core 102 (shown in FIG. 2). In some embodiments, the housing 1904 may include a housing back panel and housing side panels. The housing back panel is connected with the panel 1903 through the housing side panels. The driving component 1901 may transmit vibration signal(s) to the panel 1903 and/or the housing 1904 through the transmission component 1902, so as to transmit a sound to human body by contacting human skin through the panel 1903 or the housing 1904. In some embodiments, the panel 1903 and/or the housing 1904 may be in contact with human skin at the tragus, so as to transmit a sound to human body. In some embodiments, the panel 1903 and/or the housing 1904 may be in contact with human skin on the back of the auricle.

In some embodiments, a straight line B (or a vibrating direction of a driving device) of a driving force generated by the driving component 1901 and a normal line A of the panel 1903 may form an angle θ. In other words, the straight line B is not parallel to the normal line A.

The panel has an area that contacts or abuts the user's body, such as human skin. It should be understood that when the panel is covered with other materials (such as silicone and other soft materials) to enhance the user's wearing comfortability, the panel and the user's body are not in direct contact, but abut against each other. In some embodiments, when the bone conduction speaker is worn on the user's body, the whole area of the panel contacts or abuts the user's body. In some embodiments, when the bone conduction speaker is worn on the user's body, a part of the panel contacts or abuts the user's body. In some embodiments, the area of the panel contacting or abutting the user's body may account for more than 50% of the entire area of the panel. More preferably, it may account for more than 60% of the entire area of the panel. In general, the area of the panel contacting or abutting the user's body may be flat or curved.

In some embodiments, when the area of the panel contacting or abutting the user's body is a flat surface, its normal line meets the general definition, that is, a dashed line perpendicular to the flat surface. In some embodiments, when the area contacting or abutting the user's body of the panel is a curved surface, its normal line is the average normal line of the area, wherein, the average normal line is defined as follows:

$$\hat{r}_0 = \frac{\oiint_S \hat{r}\, ds}{\left|\oiint_S \hat{r}\, ds\right|} \tag{1}$$

where, $\hat{r}_0$ is the average normal line; $\hat{r}$ is the normal line of any point on the curved surface; ds is a surface unit.

Further, the curved surface is a quasi-flat surface that is close to the flat surface. That is, the curved surface is a surface that an angle between a normal line of any point of at least 50% of the area on the curved surface and the average normal line is less than a set threshold. In some embodiments, the set threshold may be less than 10°. In some embodiments, the set threshold may be less than 5°.

In some embodiments, the straight line B of the driving force and the normal line A' of the area of the panel 1903 for contacting or abutting the user's body may form the angle θ. A value range of the angle θ may be 0<θ<180°. Further, the value range may be 0<θ<180° and not equal to 90°. In some embodiments, it is assumed that the straight line B has a positive direction pointing to the outside of the bone conduction speaker, and the normal line A of the panel 1903 (or the normal line A' of a contact surface of the panel 1903 and the human skin) also has a positive direction pointing to the outside of the bone conduction speaker. Thus, the angle θ formed by the normal line A or A' and the straight line B in the positive direction is an acute angle, that is, 0<θ<90°. More descriptions about the normal line A and A' may be found in FIG. 21 and the descriptions thereof.

Figure 20:
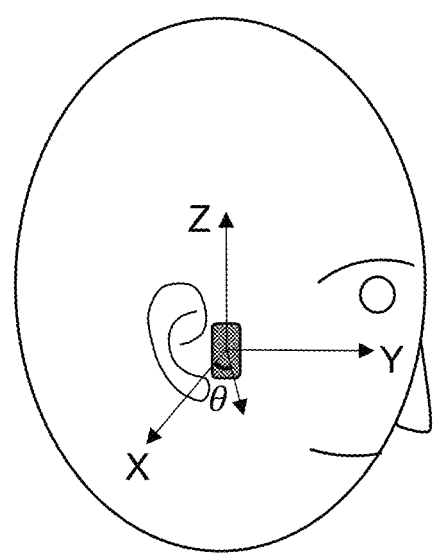
FIG. 20 is a schematic diagram illustrating a direction of an included angle according to some embodiments of the present disclosure.

FIG. 20 is a schematic diagram illustrating a direction of an included angle according to some embodiments of the present disclosure. As shown in FIG. 20, in some embodiments, a driving force generated by a driving device has a component in a first quadrant and/or a third quadrant of an XOY plane coordinate system. As used herein, the XOY plane coordinate system is a reference coordinate system whose origin O is located on a contact surface between the panel and/or the housing and the human body after the bone conduction speaker is worn on the human body. The X axis is parallel to the coronal axis of the human body, the Y axis is parallel to the sagittal axis of the human body, and the positive direction of the X axis faces the outside of the human body, the positive direction of the Y axis faces the front of the human body. Quadrants should be understood as four regions divided by the horizontal axis (such as X axis) and the vertical axis (such as Y axis) in a rectangular coordinate system. Each region is a quadrant. The quadrant is centered at the origin, and the X axis and Y axis are the dividing lines. The upper right region (the region enclosed by the positive half axis of the X axis and the positive half axis of the Y axis) is the first quadrant, the upper left region (the region enclosed by the negative half axis of the X axis and the positive half axis of the Y axis) is the second quadrant, the lower left region (the region enclosed by the positive half axis of the X axis and the negative half axis of the Y axis) is the third quadrant, and the lower right region (the region enclosed by the positive half axis of the X axis and the negative half axis of the Y axis) is the fourth quadrant. The points on the X axis and the Y axis do not belong to any quadrant. It should be understood that the driving force in the embodiment may be directly located in the first quadrant and/or the third quadrant of the XOY plane coordinate system, or the driving force may point to other directions, but the projection or component in the first quadrant and/or the third quadrant is not equal to 0 in the XOY plane coordinate system, and the projection or component in a direction of a Z axis may be equal to 0 or not equal to 0. As used herein, the Z axis is perpendicular to the XOY plane and passes through the origin O. In some embodiments, the angle θ between the straight line of the driving force and the normal line of the area contacting or abutting the user's body of the panel may be any acute angle, for example, the range of the angle θ is 5°~80°. More preferably, the range is 15°~70°. More preferably, the range is 25°~60°. More preferably, the range is 25°~50°. More preferably, the range is 28°~50°. More preferably, the range is 30°~39°. More preferably, the range is 31°~38°. More preferably, the range is 32°~37°. More preferably, the range is 33°~36°. More preferably, the range is 33°~35.8°. More preferably, the range is 33.5°~35°. Specifically, the angle θ may be 26°, 27°, 28°, 29°, 30°, 31°, 32°, 33°, 34°, 34.2°, 35°, 35.8°, 36°, 37°, 38°, etc., wherein the error is controlled within 0.2°. It should be noted that the illustrations of the driving force direction described above should not be interpreted as a limitation of the driving force in the present disclosure. In other embodiments, the driving force may also have component in the second and fourth quadrants of the XOY plane coordinate system, even the driving force may be located on the Y axis, or the like.

Figure 21:
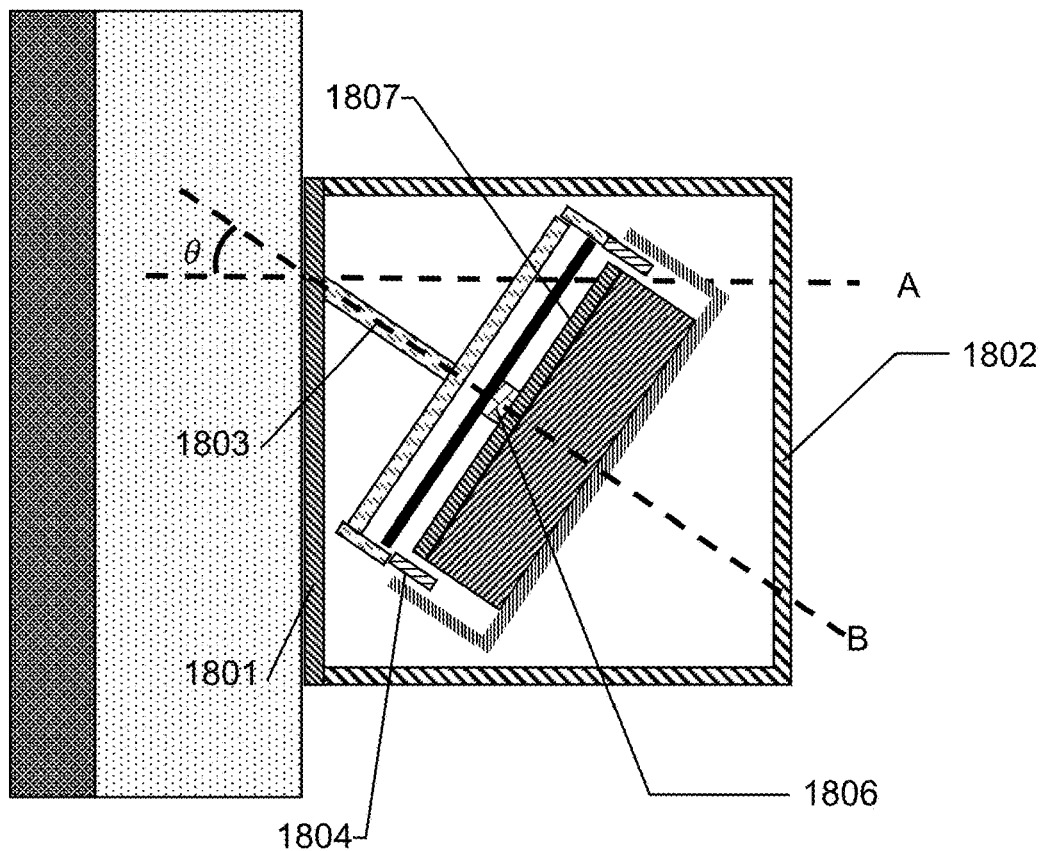
FIG. 21 is a structural diagram of a bone conduction speaker acting on human skin and bones according to the present disclosure.

FIG. 21 is a structural diagram of a bone conduction speaker acting on human skin and bones according to the present disclosure.

In some embodiments, the straight line of the driving force is collinear or parallel to the straight line of the vibration of the driving device. For example, in a driving device based on the moving-coil principle, the direction of the driving force may be the same as or opposite to the vibrating direction of the coil and/or the magnetic circuit component. The panel may have a flat surface or curved surface, or there are a plurality of protrusions or grooves on the panel. In some embodiments, when the bone conduction speaker is worn on the user's body, the normal line of the area contacting or abutting the user's body of the panel is not parallel to the straight line of the driving force. In general, the area contacting or abutting the user's body of the panel is flat relatively. Specifically, it may have a flat surface, or a quasi-flat plane with little curvature. When the area contacting or abutting the user's body of the panel has a flat surface, the normal line of any point on it may be the normal line of the area. At this time, the normal line A of the panel 1903 may be parallel or coincident to the normal line A' of the contact surface between the panel 1903 and human skin. When the panel used to contact the user's body is non-planar, the normal line of the area may be the average normal line. More detailed definition of the average normal line may be found in FIG. 19 and the descriptions thereof. In some other embodiments, when the panel used to contact the user's body is non-planar, the normal line of the area may also be determined as follows: selecting a certain point in an area when the panel is in contact with human skin, determining a tangent plane of the panel at the selected point, determining a straight line that passes through the point and is perpendicular to the tangent plane, and designating the straight line as the normal line of the panel. When the panel used to contact the user's body is non-planar, different points correspond to different tangent planes of the panel, and the determined normal line may also be different. At this time, the normal line A' is not parallel to the normal line A of the panel. According to a specific embodiment of the present disclosure, the straight line of the driving force (or the straight line of the vibration of the driving device) and the normal line of the area may form an angle θ, where 0<θ<180°. In some embodiments, when the straight line of the driving force has a positive direction pointing to the outside of the bone conduction speaker from the panel (or the contact surface between the panel and/or the housing and human skin), and the normal line of the designated panel (or the contact surface between the panel and/or the housing and human skin) has a positive direction pointing to the outside of the bone conduction speaker, the angle formed by the two straight lines in the positive direction is an acute angle.

As shown in FIG. 21, the bone conduction speaker may include a driving device (also referred to as a transducer in other embodiments), a transmission component 1803, a panel 1801, and a housing 1802. In some embodiments, a coil 1804 and a magnetic circuit component 1807 are both ring-shaped. In some embodiments, the driving device adopts a moving-coil driving mode, and includes the coil 1804 and the magnetic circuit component 1807.

In some embodiments, the coil 1804 and the magnetic circuit component 1807 have axes parallel to each other. The axis of the coil 1804 or the magnetic circuit component 1807 is perpendicular to the radial plane of the coil 1804 and/or the magnetic circuit component 1807. In some embodiments, the coil 1804 and the magnetic circuit component 1807 have the same central axis. The central axis of the coil 1804 is perpendicular to the radial plane of the coil 1804 and passes through the geometric center of the coil 1804. The central axis of the magnetic circuit component 1807 is perpendicular to the radial plane of the magnetic circuit component 1807 and passes through the geometric center of the magnetic circuit component 1807. The axis of the coil 1804 or the magnetic circuit component 1807 and the normal line of the panel 1801 may form the angle θ described above.

Merely by way of example, the relationship between the driving force F and the deformation S of the skin will be illustrated below combined with FIG. 21. When the straight line of the driving force generated by the driving device is parallel to the normal line of the panel 1801 (i.e., the angle θ is zero), the relationship between the driving force and the total deformation of the skin is:

$$F_\perp = S_\perp \times E \times A/h \qquad (2)$$

where, $F_\perp$ denotes the driving force, $S_\perp$ denotes the total deformation of the skin in the direction perpendicular to the skin, E denotes the elastic modulus of the skin, A denotes the contact area between the panel and the skin, h denotes a total thickness of the skin (i.e., the distance between the panel and the bone).

When the straight line of the driving force generated by the driving device is parallel to the normal line of the area contacting or abutting the user's body of the panel (i.e., the angle θ is 90°), the relationship between the driving force in the vertical direction and the total deformation of the skin may be shown in Equation (3):

$$F_\| = S_\| \times G \times A/h \qquad (3)$$

where, $F_\|$ denotes the driving force, $S_\|$ denotes the total deformation of the skin in the direction parallel to the skin, G denotes the shear modulus of the skin, A denotes the contact area between the panel and the skin, h denotes total thickness of the skin (i.e., the distance between the panel and the bone).

The relationship between the shear modulus G and the elastic modulus E is:

$$G = E/2(1+\gamma) \qquad (4)$$

where, γ denotes the Poisson's ratio of the skin 0<γ<0.5. Thus the shear modulus G is less than the elastic modulus E, and under the same driving force, the corresponding total deformation of the skin $S_\| > S_\perp$. Generally, the Poisson's ratio of the skin is close to 0.4.

When the straight line of the driving force generated by the driving device is not parallel to the normal line of the area contacting or abutting the user's body of the panel, the driving force in the horizontal direction and the driving force in the vertical direction are expressed as the Equation (5) and Equation (6), respectively:

$$F_\perp = F \times \cos(\theta) \qquad (5)$$

$$F_\| = F \times \sin(\theta) \qquad (6)$$

where, the relationship between the driving force F and the deformation S of the skin may be shown in the following equation:

$$S = \sqrt[2]{S_\perp^2 + S_\|^2} = \frac{h}{A} \times F \times \sqrt[2]{(\cos(\theta)/E)^2 + (\sin(\theta)/G)^2} \qquad (7)$$

When the Poisson's ratio is 0.4, the descriptions regarding the relationship between the angle θ and the total deformation of the skin may be found elsewhere of the present disclosure.

Figure 22:
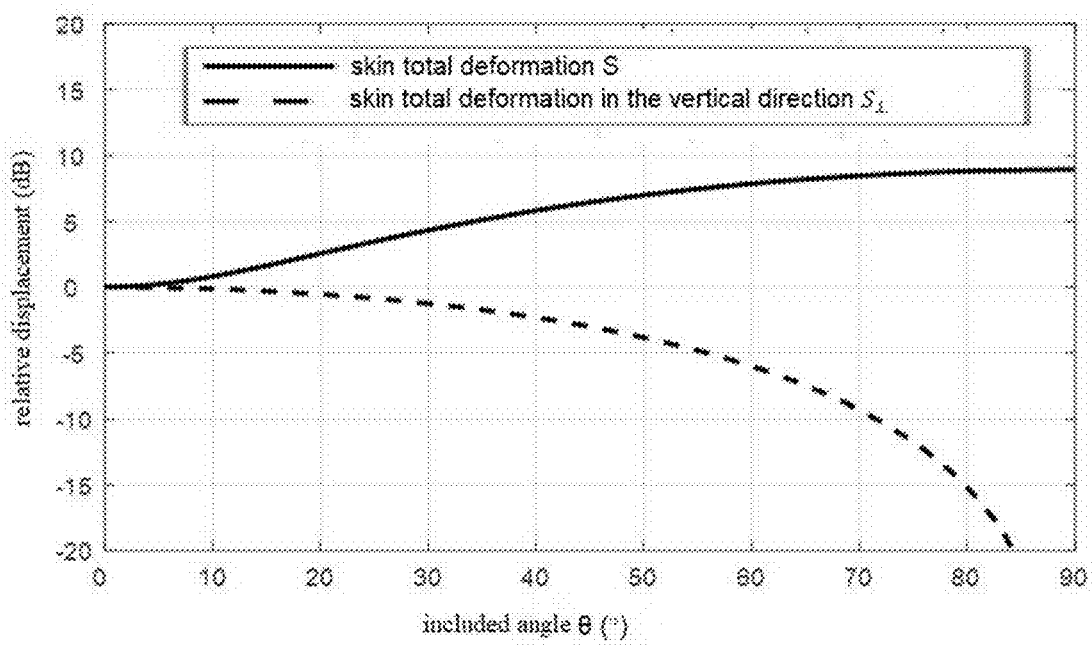
FIG. 22 is a diagram illustrating an angle-relative displacement relationship of a bone conduction speaker according to some embodiments of the present disclosure.

FIG. 22 is a diagram illustrating an angle-relative displacement relationship of a bone conduction speaker according to some embodiments of the present disclosure. As shown in FIG. 22, the relationship between the angle θ and the total deformation of the skin is that the greater the angle θ, and the greater the relative displacement, the greater the total deformation S of the skin. The greater the angle θ, and the less the relative displacement, the less the deformation $S_\perp$ of the skin in the vertical direction of the skin. When the angle θ is close to 90°, the deformation $S_\perp$ of the skin in the vertical direction of the skin gradually tends to 0.

The volume of the bone conduction speaker in the low frequency part is positively correlated with the total deformation of the skin S. The larger the S, the larger the volume of the bone conduction speaker in low frequency. The volume of the bone conduction speaker in the high frequency part is positively correlated with the deformation $S_\perp$ of the skin in the vertical direction of the skin. The larger the $S_\perp$ the larger the volume of the bone conduction speaker in low frequency.

When the Poisson's ratio of the skin is 0.4, the detailed illustration of the relationship between the angle θ and total deformation of the skin S, the deformation $S_\perp$ of the skin in the vertical direction of the skin may be found in FIG. 22. As shown in FIG. 22, the relationship between the angle θ and the total deformation of the skin S is that the larger the angle θ and the larger the total deformation of the skin S, the larger the volume of the corresponding bone conduction speaker in the low frequency part. As shown in FIG. 22, the relationship between the angle θ and the deformation $S_\perp$ of the skin in the vertical direction of the skin is that the larger the angle θ and the smaller the deformation $S_\perp$ of the skin in the vertical direction of the skin, the smaller the volume of the corresponding bone conduction speaker in the high frequency part.

It may be seen from Equation (7) and curves in the FIG. 22 that with the increase of the angle θ, the speed at which the total deformation of the skin S increases is different from the speed at which the deformation $S_\perp$ of the skin in the vertical direction of the skin decreases. The speed at which the total deformation of the skin S increases becomes faster at first, and then becomes slower, and the speed at which the deformation $S_\perp$ of the skin in the vertical direction of the skin decreases becomes faster and faster. In order to balance the volume of the bone conduction speaker in the low frequency part and the high frequency part, the angle θ should be at an appropriate value, for example, within a range of δ is 5°~80°, 15°~70°, 25°~50°, 25°~35°, 25°~30°, or the like.

Figure 23:
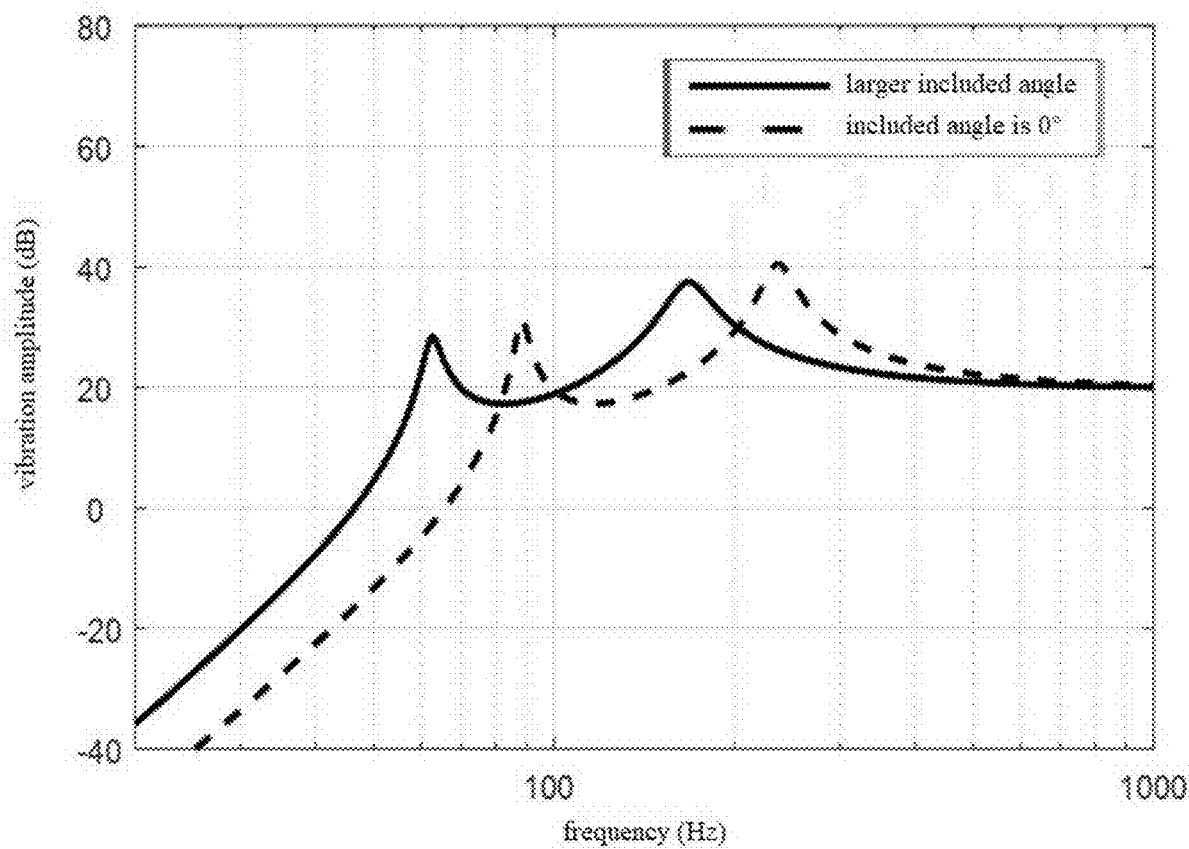

FIG. 23 is a schematic diagram illustrating frequency response curves of a bone conduction speaker in a low-frequency part correspond to different angles θ according to some embodiments in the present disclosure. As shown in FIG. 23, the panel is in contact with the skin and transmits vibration to the skin. During this process, the skin may also affect the vibration of the bone conduction speaker, so as to affect the frequency response curve of the bone conduction speaker. From the above analysis, it is found that the larger the included angle, the larger the total deformation of the skin under the same driving force, and for the bone conduction speaker, it is equivalent to that the elasticity of the skin relative to the panel decreases. It may be further understood that when a certain angle θ is formed between the straight line of the driving force generated by the driving device and the normal line of the area contacting or abutting the user's body of the panel. Especially when the angle θ increases, the resonance peak in the low frequency area of the frequency response curve may be adjusted to a lower frequency area, thus making the low frequency to dive deeper and increasing signals in the low frequencies. Compared with other techniques to improve the low frequency components of the sound (e.g., adding a vibration transmission plate to the bone conduction speaker), setting the included angle may suppress the increase of the vibration effectively while increasing the energy of the low frequency, so as to reduce the sense of vibration, which improves the sensitivity of the low frequency of the bone conduction speaker significantly, and improves the sound quality and human experience. It should be noted that, in some embodiments, the increase of the low frequency and the reduction of the vibration may be expressed as when the angle θ increases in the range of (0, 90°), the energy in the range of the low frequency of the vibration or the sound signal(s) increases, and the sense of vibration also increases, but the degree of energy increase in the low frequency range is greater than the degree of vibration sensation increase. Thus, in relative effect, the vibration sensation is reduced relatively. It may be seen in FIG. 23, when the included angle is relatively large, the resonance peak in the low frequency area may appear in a lower frequency range, which extends the flat part of the frequency curvature, so as to improve the sound quality of the speaker.

It should be noted that the illustration of the bone conduction speaker described above is only a specific example, and should not be regarded as the only feasible implementation. Obviously, for those skilled in the art, after the basic principles of the bone conduction speaker, it may be possible to make various modifications and changes in forms and details of the specific methods and steps for implementing the bone conduction speaker without departing from the principles, but the modifications and changes are still within the scope illustrated above. For example, the minimum angle θ between the straight line of the driving force generated by the driving device and the normal line of the area contacting or abutting the user's body of the panel may be any acute angle. The acute angle herein is not limited to 5°~80° described above. The angle θ may be less than 5°, such as 1°, 2°, 3°, 4°, etc. In other embodiments, the angle θ may be larger than 80° and less than 90°, such as 81°, 82°, 85°, etc. In some embodiments, the specific value of the angle θ may not be an integer (e.g., 81.3°, 81.38°). Such deformations are all within the protection scope of the present disclosure.

Figure 24:
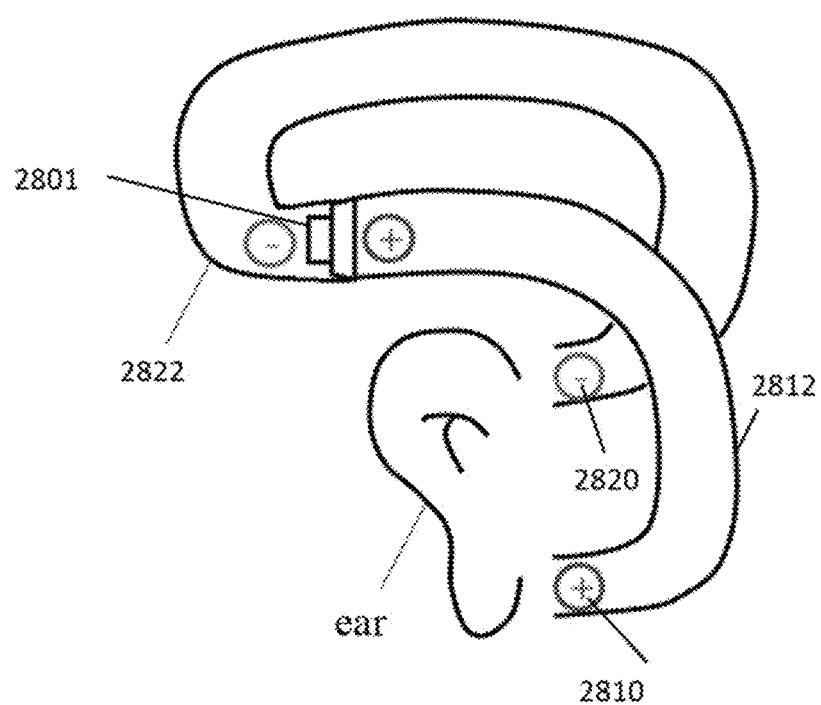
FIG. 24 is a schematic diagram of transmitting a sound through air conduction according to some embodiments of the present disclosure.

In some embodiments, the speaker described above may also transmit the sound to the user through air conduction. When the air condition is used to transmit the sound, the speaker may include one or more sound sources. The sound source may be located at a specific position of the user's head, for example, the top of the head, a forehead, a cheek, a temple, an auricle, the back of an auricle, etc., without blocking or covering an ear canal. FIG. 24 is a schematic diagram illustrating transmitting a sound through air conduction according to some embodiments of the present disclosure.

As shown in FIG. 24, a sound source 2810 and a sound source 2820 may generate sound waves with opposite phases ("+" and "−" in the figure may indicate the opposite phases). For brevity, the sound sources mentioned herein may refer to sound outlets of the speaker that may output sounds. For example, the sound source 2810 and the sound source 2820 may be two sound outlets respectively located at specific positions of the speaker (e.g., the core housing 108, or the eyeglass temple 15).

In some embodiments, the sound source 2810 and the sound source 2820 may be generated by the same vibration device 2801. The vibration device 2801 may include a diaphragm (not shown in the figure). When the diaphragm is driven to vibrate by an electric signal, the front side of the diaphragm may drive air to vibrate. The sound source 2810 may form at the sound output through a sound guiding channel 2812. The back of the diaphragm may drive air to vibrate, and the sound source 2820 may be formed at the sound output hole through a sound guiding channel 2822. The sound guiding channel may refer to a sound transmission route from the diaphragm to the corresponding outlet. In some embodiments, the sound guiding channel may be a route surrounded by a specific structure (e.g., the core housing 108 in FIG. 1, or the eyeglass temple 15 in FIG. 7) on the speaker. It should to be known that in some alternative embodiments, the sound source 2810 and the sound source 2820 may also be generated by different vibrating diaphragms of different vibration devices, respectively.

Among the sounds generated by the sound source 2810 and the sound source 2820, one portion may be transmitted to the ear of the user to form the sound heard by the user. Another portion may be transmitted to the environment to form a leaked sound. Considering that the sound source 2810 and the sound source 2820 are relatively close to the ears of the user, for convenience of description, the sound transmitted to the ears of the user may be referred to as a near-field sound. The leaked sound transmitted to the environment may be referred to as a far-field sound. In some embodiments, the near-field/far-field sounds of different frequencies generated by the speaker may be related to a distance between the sound source 2810 and the sound source 2820. Generally speaking, the near-field sound generated by the speaker may increase as the distance between the two sound sources increases, while the generated far-field sound (the leaked sound) may increase with increasing the frequency.

For the sounds of different frequencies, the distance between the sound source 2810 and the sound source 2820 may be designed, respectively, so that a low-frequency near-field sound (e.g., a sound with a frequency of less than 800 Hz) generated by the speaker may be as large as possible and a high-frequency far-field sound (e.g., a sound with a frequency greater than 2000 Hz) may be as small as possible. In order to implement the above purpose, the speaker may include two or more sets of dual sound sources. Each set of the dual sound sources may include two sound sources similar to the sound source 2810 and the sound source 2820, and generate sounds with specific frequencies, respectively. Specifically, a first set of the dual sound sources may be used to generate low frequency sounds. A second set of the dual sound sources may be used to generate high frequency sounds. In order to obtain more low-frequency near-field sounds, the distance between two sound sources in the first set of the dual sound sources may be set to a larger value. Since the low-frequency signal has a longer wavelength, the larger distance between the two sound sources may not cause a large phase difference in the far-field, and not form excessive leaked sound in the far-field. In order to make the high-frequency far-field sound smaller, the distance between the two sound sources in the second set of the dual sound sources may be set to a smaller value. Since the high-frequency signal has a shorter wavelength, the smaller distance between the two sound sources may avoid the generation of the large phase difference in the far-field, and thus the generation of the excessive leaked sounds may be avoided. The distance between the second set of the dual sound sources may be less than the distance between the first set of the dual sound sources.

It should be noted that the above description of the sound conduction manner for changing the air conduction may be only a specific example, and should not be considered as the only feasible implementation. Obviously, for those skilled in the art, after understanding the basic principles of the air conduction, it may be possible to target air conduction speaker of different shapes and structures without departing from these principles, but these changes may still be within the scope of the above description. For example, the sound guiding channel 2822 may be disposed in the eyeglasses according to other descriptions. All such variations are within the protection scope of the present disclosure.

The beneficial effects of the embodiments of the present disclosure may include but be not limited to the following. (1) Through the rotating shaft, the eyeglass rim and eyeglass temple may be connected, thereby protecting the connection wire in the eyeglasses, and extending the life of the connection wire. (2) The flexible circuit board may simplify the wiring manner in the speaker. (3) The user may adjust the fitting position of the speaker according to his or her own preferences and habits, which meets the requirement of the user. (4) The sound quality of the speaker may be improved by adjusting the angle θ between the normal line A of the panel or the normal line A' of the panel contacting human skin and the straight line B of the driving force generated by the driving device. It should be noted that different embodiments may have different beneficial effects. In different embodiments, the possible beneficial effects may be any one or a combination of the above, and may be any other beneficial effects that may be obtained.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

What is claimed is:

1. A pair of eyeglasses, wherein the eyeglasses include:
an eyeglass rim;
an eyeglass temple, the eyeglass temple comprising a control circuit;
a rotating shaft, the rotating shaft being configured to connect the eyeglass rim and the eyeglass temple, so that the eyeglass rim and the eyeglass temple are relatively rotated around the rotating shaft, and the rotating shaft being disposed with a rotating shaft wiring channel along an axial direction;
a connection wire, the connection wire passing through the rotating shaft wiring channel and extending to the eyeglass rim and the eyeglass temple, respectively; and
a speaker, the speaker comprising an earphone core, the speaker being connected to the eyeglass temple, the control circuit in the eyeglass temple driving the earphone core to vibrate through the connection wire, wherein the earphone core vibrates to generate a driving force to drive a housing panel of the speaker to vibrate, and a straight line of the driving force is not parallel to a normal line of the housing panel.

2. The eyeglasses of claim 1, wherein
the rotating shaft includes a first rotating shaft;
two ends of the first rotating shaft are respectively connected to the eyeglass rim and the eyeglass temple;
the rotating shaft wiring channel is disposed along an axial direction of the first rotating shaft;
the rotating shaft wiring channel communicates with an outside through a wiring port disposed on at least one end surface of the first rotating shaft; and
the connection wire extends to the eyeglass rim or the eyeglass temple through the wiring port.

3. The eyeglasses of claim 2, wherein
the rotating shaft wiring channel communicates with the outside through a first wiring port and a second wiring port respectively disposed on two end surfaces of the first rotating shaft; and
the connection wire extends to the eyeglass rim and the eyeglass temple through the first wiring port and the second wiring port, respectively.

4. The eyeglasses of claim 2, wherein
the rotating shaft wiring channel communicates with the outside through a first wiring port disposed on an end surface of the first shaft and a second wiring port disposed on a side wall of the first shaft; and
the connection wire extends to the eyeglass rim and the eyeglass temple through the first wiring port and the second wiring port, respectively.

5. The eyeglasses of claim 4, wherein the first rotating shaft is fixedly connected to one of the eyeglass rim and the eyeglass temple disposed near the second wiring port, and rotatably connected to another of the eyeglass rim and the eyeglass temple disposed near the first wiring port.

6. The eyeglasses of claim 4, wherein the rotating shaft further comprises a second shaft that is coaxial with and spaced from the first shaft;
the eyeglass rim includes a first lug, and the eyeglass temple includes a second lug and a third lug disposed at intervals;
end portions of the first rotating shaft and the second rotating shaft close to each other are connected to the first lug, end portions of the first rotating shaft and the second rotating shaft away from each other are connected to the second lug and the third lug, respectively, so as to keep the first lug between the second lug and the third lug.

7. The eyeglasses of claim 6, wherein
the first wiring port is disposed on an end surface of the first rotating shaft close to the second rotating shaft;
the second wiring port is disposed on a side wall of the first rotating shaft close to the second lug; and
the first rotating shaft is rotatably connected to the first lug and fixedly connected to the second lug.

8. The eyeglasses of claim 7, wherein
the first lug and the second lug are coaxially disposed with a first accommodating hole and a second accommodating hole; and
sizes of the first accommodating hole and the second accommodating hole are disposed to allow the first rotating shaft to be inserted into the first accommodating hole from outside of the eyeglass temple via the second accommodating hole and allow the first rotating shaft in an interference fit with the second accommodating hole and in a clearance fit with the first accommodating hole.

9. The eyeglasses of claim 7, wherein
the first lug and the third lug are coaxially disposed with a third accommodating hole and a fourth accommodating hole; and
sizes of the third accommodating hole and the fourth accommodating hole are disposed to allow the second rotating shaft to be inserted into the third accommodating hole from outside of the eyeglass temple via the fourth accommodating hole and allow the second rotating shaft in an interference fit with the third accommodating hole and in a clearance fit with the fourth accommodating hole, or allow the second rotating shaft in a clearance fit with the third accommodating hole and in an interference fit with the fourth accommodating hole.

10. The eyeglasses of claim 9, wherein
the second rotating shaft is a solid shaft;
a diameter of the second rotating shaft is less than a diameter of the first rotating shaft;
in a wearing state, the second rotating shaft is located at an upper side of the eyeglass temple, and the first rotating shaft is located at a lower side of the eyeglass temple; and
a connection between the end surface of the first rotating shaft for disposing the first wiring port and a surface of an inner wall of the first rotating shaft for defining the rotating shaft wiring channel is an arc shape.

11. The eyeglasses of claim 1, wherein the speaker further comprises:
an auxiliary function module configured to receive an auxiliary signal and execute an auxiliary function;
a flexible circuit board configured to electrically connect to an audio signal wire and an auxiliary signal wire of the control circuit, and electrically connect the audio signal wire and the auxiliary signal wire with the earphone core and the auxiliary function module via the flexible circuit board, respectively; and
a core housing configured to accommodate the earphone core, the auxiliary function module, and the flexible circuit board.

12. The eyeglasses of claim 11, wherein
the flexible circuit board at least comprises a number of first pads and a number of second pads;
at least one of the number of first pads is electrically connected to the audio signal wire, the at least one first pad is electrically connected to at least one of the number of second pads via a first flexible lead on the flexible circuit board, and the at least one second pad is electrically connected to the earphone core via an external wire; and
at least another one of the number of first pads is electrically connected to the auxiliary signal wire, and the at least another one first pad is electrically connected to the auxiliary function module via a second flexible lead on the flexible circuit board.

13. The eyeglasses of claimer 12, wherein
the flexible circuit board includes at least a main circuit board and a first branch circuit board;
the first branch circuit board is connected to the main circuit board, away from the main circuit board, and extend along one end of the main circuit board;
the auxiliary function module includes at least a first auxiliary function module and a second auxiliary function module;
the first auxiliary function module is disposed on the main circuit board; and
the second auxiliary function module is disposed on the first branch circuit board.

14. The eyeglasses of claim 12, wherein the earphone core includes:
a magnetic circuit component configured to provide a magnetic field;
a vibration component, the vibration component comprising a coil and an inner lead, wherein
the coil is located in the magnetic field,
the inner lead is electrically connected to the coil,
the coil receives an audio current via the inner lead and converts the audio current into a mechanical vibration signal under an action of the magnetic field,
one end of the external wire is electrically connected to the second pad, and
the other end of the external wire is electrically connected to the inner lead, and transmitting the audio current to the coil.

15. The eyeglasses of claim 14, wherein
the housing panel and the earphone core are in a transmission connection, and all or part of the housing panel is used to contact or abut a user's body to conduct a sound generated by the vibration of the earphone core.

16. The eyeglasses of claim 15, wherein when the straight line of the driving force has a positive direction pointing to the outside of the speaker from the housing panel and the normal line has a positive direction pointing to the outside of the speaker, an angle between the two lines in their positive direction is an acute angle.

17. The eyeglasses of claim 15, wherein
an axis of the coil or a magnetic circuit system is not parallel to the normal line;
the axis is perpendicular to a radial plane of the coil or the magnetic circuit system.

18. The eyeglasses of claim 15, wherein the driving force has a component in a first quadrant or a third quadrant of an XOY plane coordinate system; wherein:
an origin O of the XOY plane coordinate system is on a contact surface between the speaker and a human body, an X axis is parallel to a coronal axis of the human body, a Y axis is parallel to a sagittal axis of the human body, and a positive direction of the X axis faces the outside of the human body, a positive direction of the Y axis faces the front of the human body.

19. The eyeglasses of claim 15, wherein a region of the housing panel used to contact or abut the user's body comprises a flat surface or a quasi-flat surface.

20. The eyeglasses of claim 1 wherein the speaker is connected to the eyeglass temple via a hinge component, wherein the hinge component can rotate to change a position of the speaker relative to the eyeglass temple, so as to make the speaker to fit in front of or behind an ear of the user.

* * * * *